United States Patent
Laurent et al.

(10) Patent No.: US 12,321,610 B2
(45) Date of Patent: Jun. 3, 2025

(54) BALANCED CODEWORDS FOR REDUCING A SELECTED STATE IN MEMORY CELLS

(71) Applicant: Micron Technology, Inc., Boise, ID (US)

(72) Inventors: Christophe Vincent Antoine Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 336 days.

(21) Appl. No.: 17/887,239

(22) Filed: Aug. 12, 2022

(65) Prior Publication Data

US 2024/0053902 A1 Feb. 15, 2024

(51) Int. Cl.
*G06F 3/06* (2006.01)
*G06F 11/10* (2006.01)

(52) U.S. Cl.
CPC .......... *G06F 3/0619* (2013.01); *G06F 3/0629* (2013.01); *G06F 3/0673* (2013.01); *G06F 11/1012* (2013.01)

(58) Field of Classification Search
CPC .... G06F 3/0619; G06F 3/0673; G06F 3/0629; G06F 11/1012
See application file for complete search history.

(56) References Cited

U.S. PATENT DOCUMENTS

| | | | |
|---|---|---|---|
| 11,494,264 B2* | 11/2022 | Laurent | G06F 11/1076 |
| 2011/0225472 A1* | 9/2011 | Sommer | G06F 11/1068 |
| | | | 714/719 |
| 2022/0035706 A1* | 2/2022 | Laurent | G06F 11/1012 |
| 2022/0035707 A1* | 2/2022 | Laurent | G06F 11/1076 |
| 2022/0222141 A1* | 7/2022 | Laurent | G06F 11/1012 |
| 2023/0079610 A1* | 3/2023 | Laurent | G06F 11/1076 |
| | | | 714/764 |
| 2024/0053902 A1* | 2/2024 | Laurent | G06F 3/0673 |
| 2024/0272985 A1* | 8/2024 | Laurent | G06F 11/1012 |

* cited by examiner

*Primary Examiner* — Samir W Rizk
(74) *Attorney, Agent, or Firm* — Holland & Hart LLP

(57) ABSTRACT

Methods, systems, and devices for balanced codewords for reducing a selected state in memory cells are described. A memory device may divide a sequence of data bits into sets of bits associated with different bit-positions in a coding scheme. The memory device may then balance a first codeword that includes the first set of the data bits in the binary domain to reach a target ratio of logic values for the codeword. Using the first codeword and the other set(s) of data bits, the memory device may balance the remaining two states in the state domain to reach an overall target distribution of the three states. The memory device may then generate one or more codeword(s) for the other set(s) of data bits so that the memory device can write all of the codewords to ternary cells.

13 Claims, 10 Drawing Sheets

Same Polarity Sensing

Opposite Polarity Sensing

Coding Scheme 300-b

|  | Bi | Ci | Ai |
|---|---|---|---|
| Bj | X | 100 | 110 |
| Cj | 101 | 000 | 010 |
| Aj | 111 | 011 | 001 |

(Cell i State / Cell j State; (x,y,z) Values)

y-bit value: Given by odd/even parity of cells in State A
x-bit value: Given by quantity of cells in State B Coding Scheme 300-a Coding Scheme 300-c

300

Divide Data Sequence

Generate Codeword(x)

Codeword(x)

Balance Codeword(x) in Binary Domain and Determine Balancing Index

Add Padding Bits

Codeword(x)

Convert to State Domain

Balance States A/C in State Domain and Determine Balancing Index

Convert to Binary Domain

Generate Codeword(y), Codeword(z)

Add Padding Bits

Write Codewords 400 (Cont.)

BALANCED CODEWORDS FOR REDUCING A SELECTED STATE IN MEMORY CELLS

FIELD OF TECHNOLOGY

The following relates to one or more systems for memory, including balanced codewords for reducing a selected state in memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
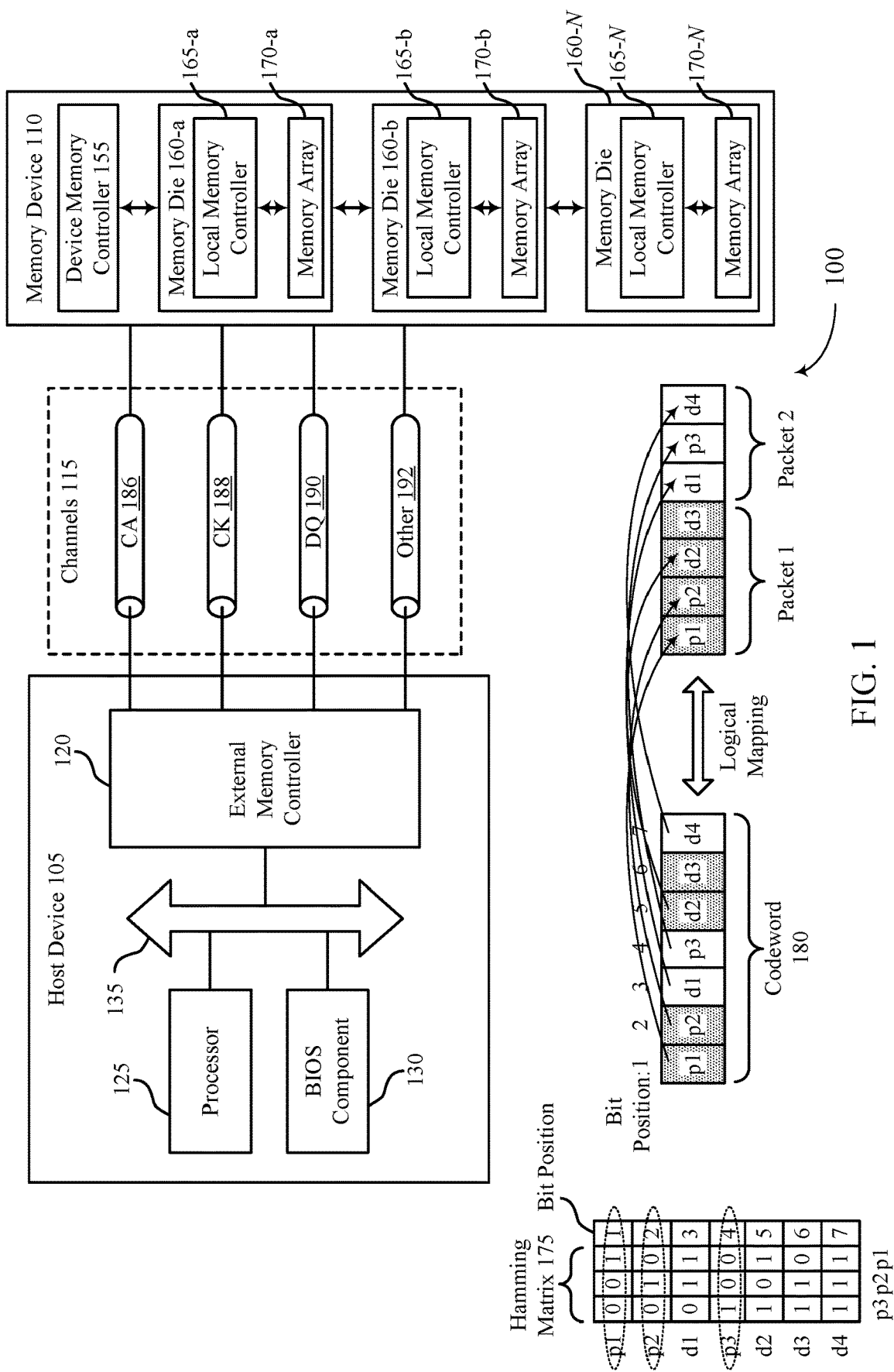
FIG. 1 illustrates an example of a system that supports balanced codewords for reducing a selected state in memory cells in accordance with examples as disclosed herein.

A memory device may include memory cells with threshold voltages that drift over time, which may negatively impact sensing accuracy, among other issues. To compensate for threshold voltage drift in binary cells (e.g., which may be programmable to two target threshold levels) the memory device may implement a reference scheme that relies on fixed weight codewords (e.g., codewords with a fixed ratio of logic ones and logic zeros). But techniques used to generate fixed weight codewords for storage in binary cells may not be compatible with some types of cells, such as ternary cells (e.g., which may be programmable to three target threshold voltages, referred to herein as states). So, a memory device may implement the techniques described herein to 1) generate fixed weight codewords for storage in some types of cells, such as ternary cells, and 2) use the fixed weight codewords to set read voltages as part of a dynamic sensing technique for the types of cells, such as ternary cells. The techniques implemented by the memory device may also allow the memory device to generate the fixed weight codewords so that the quantity of cells in an undesirable state (e.g., the state most susceptible to errors, the state that requires the most power to write) is reduced relative to other states and relative to other different techniques.

According to the techniques described herein, a memory device may divide (e.g., based on a coding scheme discussed in more detail herein) a sequence of data bits into sets of bits associated with different bit-positions in the coding scheme. The coding scheme may be selected, for example, by the memory device based on the state the memory device has targeted for reduction relative to the other states. The memory device may 1) generate a first codeword based on a first set of the data bits and 2) balance the first codeword in the binary domain to reach a target ratio of logic values for the codeword that corresponds to a target quantity of the state linked to the bit-position associated with the first codeword.

Using the first codeword and the other set(s) of data bits, the memory device may then 1) convert the sequence of bits into the state domain and 2) balance the remaining states (e.g., two states) in the state domain to reach an overall target distribution of the states (e.g., the three states). The memory device may (e.g., using the coding scheme) convert the states back into data bits and generate one or more codeword(s) for the other set(s) of data bits so that the memory device can write all of the codewords to the cells, such as the ternary cells. In some examples, during a retrieval operation for the sequence of data bits, the memory device may use the first codeword to set a first reference voltage for the ternary memory cells and may use the other codeword(s) to set a second reference voltage for the ternary memory cells.

Features of the disclosure are initially described in the context of systems and distribution curves as described with reference to FIGS. 1 and 2. Features of the disclosure are described in the context of a coding scheme, storage process, and retrieval process as described with reference to FIGS. 3 through 6. These and other features of the disclosure are further illustrated by and described with reference to an apparatus diagram and flowcharts that relate to balanced codewords for reducing a selected state in memory cells as described with reference to FIGS. 7 through 9.

FIG. 1 illustrates an example of a system 100 that supports balanced codewords for reducing a selected state in memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-$a$, memory die 160-$b$, memory die 160-N) may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store one or more bits of data. In some examples, the memory arrays 170 may be memory arrays of ternary cells. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Data stored in the memory device 110 may become corrupted over time, resulting in one or more errors in the data. To increase the reliability of the memory device 110, the memory device 110 may implement an error correction scheme to detect, identify, and correct such errors. For example, before storing a sequence of data bits the memory device 110 may use an error correction code to generate a codeword—made up of the data bits and corresponding parity bits—that can be used by the memory device 110 to detect errors in the codeword. The parity bits may be generated by applying the error correction code to the sequence of data bits, which may involve inputting the sequence of data bits into a logic circuit made up of, for example, a series of XOR logic gates. The memory device 110 may store the set of data bits and the parity bits (collectively referred to as a "codeword") in memory so that one or more errors in the codeword can be detected (and possibly corrected) during a read operation. For example, the memory device 110 may detect an error in the codeword based on syndrome bits that are generated (e.g., during a decoding process) from the bits of the codeword stored in memory. The syndrome bits may indicate the presence and location (e.g., bit-position) of an error in the codeword.

To generate a codeword, the memory device 110 may use a matrix such as Hamming matrix 175 to generate parity bits based on data bits. For ease of illustration the described Hamming matrix 175 is an example of ECC1 (e.g., an error correction code only capable detecting and correcting a single error). However, it should be appreciated that the techniques described herein may involve a higher-power error correction code so that additional errors in the codeword 180 can be detected and corrected.

The memory device (e.g., via an ECC encoder) may use a set of data bits (e.g., data bits d1 through d4) and the Hamming matrix 175 to generate an ECC-protected codeword that includes the set of data bits (e.g., data bits d1 through d4) and a set of parity bits (e.g., parity bits p1, p2, p3).

To understand how the memory device generates the parity bits, it should be appreciated that each row of the Hamming matrix 175 may be associated with a different bit of the codeword 180, which is made up of the data and the parity bits. For example, the first row of the Hamming matrix 175 may be associated with the first parity bit (p1), the second row the Hamming matrix 175 may be associated with the second parity bit (p2), the third row of the Hamming matrix 175 may be associated with the first data bit (d1), and so on and so forth as illustrated. For ease of reference the rows associated with parity bits are circled. In addition to being associated with a respective row, each parity bit may be associated with a respective column of the Hamming matrix 175. For example, the first parity bit (p1) may be associated with the third column of the Hamming matrix 175, the second parity bit (p2) may be associated with the second column of the Hamming matrix 175, and the third parity bit (p3) may be associated with the first column of the Hamming matrix 175.

To generate a parity bit, the encoder may XOR the data bits indicated by the column associated with that parity bit. For example, to generate the first parity bit (p1), the encoder may XOR the first data bit (d1), the second data bit (d2), and the fourth data bit (d4). Similarly, to generate the second parity bit (p2), the encoder may XOR the first data bit (d1), the third data bit (d3), and the fourth data bit (d4). And to generate the third parity bit (p3), the encoder may XOR the second data bit (d2), the third data bit (d3), and the fourth data bit (d4). Although described with reference to XOR operations, it should be appreciated that the techniques described herein can be implemented using other types of logic operations.

Upon generating the parity bits, the device may generate the codeword 180 with each bit positioned in the codeword 180 as indicated by the Hamming matrix 175. Thus, the first parity bit (p1) may be in the first position of the codeword 180, the second parity bit (p2) may be in the second position of the codeword 180, the first data bit (d1) may be in the third position of the codeword 180, and so on and so forth as illustrated. Thus, in the given example, the codeword 180 may include seven bits in seven positions. However, the techniques described herein can be implemented for codewords of any size.

In some examples, each bit in the codeword 180 may be mapped to a packet (or, put another way, each bit in the codeword 180 may be associated with a packet). For example, the following bits may be mapped to Packet 1: the first parity bit (p1), the second parity bit (p2), the second data bit (d2), and the third data bit (d3). And the following bits may be mapped to Packet 2: the first data bit (d1), the third parity bit (p3), and the fourth data bit (d4). For ease of reference the bits mapped to Packet 1 are shaded.

The bits mapped to a packet may be collections of bits that, when inverted together, maintain the validity of the codeword 180. For example, the bits mapped to Packet 1 (p1, p2, d2, d3) may be chosen so the validity of the codeword 180 is maintained even if Packet 1 is inverted. Similarly, the bits mapped to Packet 2 (d1, p3, d4) may be chosen so the validity of the codeword 180 is maintained even if Packet 2 is inverted. Because a packet represents a logical collection of bits, inverting a packet may refer to the inversion of each bit mapped to the packet. Thus, inverting Packet 1 may include inverting the bits mapped to Packet 1 (p1, p2, d2, d3).

As described herein, the validity of a codeword is maintained if a decoding process is unable to detect errors that have been inserted into the codeword. To illustrate how Packet 1 can be inverted without destroying the validity of the codeword 180, consider the decoding process for codeword 180. To decode the codeword 180, the device may generate a first syndrome bit by XORing all the bits indicated in the column associated with the first parity bit (p1). The device may generate a second syndrome bit by XORing all the bits indicated in the column associated with the second parity bit (p2). And the device may generate a third syndrome bit by XORing all the bits indicated in the column associated with the third parity bit (p3). If all three syndrome bits are zero, the device may determine that the codeword 180 is errorless. If one or more of the three syndrome bits are non-zero, the device may determine that the codeword 180 has an error. In addition to indicating the error, the syndrome bits may identify which bit in the codeword has the error (for example, syndrome bits '110' indicate that the error is in the sixth bit of the codeword because the decimal equivalent of binary '110' is six).

The use of such a technique allows the device to invert Packet 1 (and/or Packet 2) without invalidating the codeword 180 (provided that an appropriate combination of bits are mapped to Packet 1 and Packet 2). To illustrate, consider an inversion of Packet 1, which may occur as part of a balancing process for the codeword 180. According to the bit-map for Packet 1, inverting Packet 1 involves inverting p1 to p1', p2 to p2', d2 to d2', and d3 to d3', where the prime marking denotes an inverted bit. But, despite the inversions, the validity of the codeword 180 may be maintained due to the strategic mapping of bits to Packet 1.

Working out a simple example demonstrates this property. Consider a scenario in which the codeword 180 is made up of all zeros (e.g., the codeword 180 is '0000000'). Upon inverting Packet 1, the codeword 180 becomes '1100110' (because p1, p2, d2, and d3 are inverted). To generate the syndrome bits for the codeword 180, the decoder may XOR bit combinations of the balanced codeword 180 as indicated by the Hamming matrix 175. For example, the decoder may XOR (p d1, d2', d4) to generate the first syndrome bit, may XOR (p2, d1, d3', d4) to generate the second syndrome bit, and may XOR (p3, d2', d3', d4) to generate the third syndrome bit. Plugging in the appropriate values for the bits means that the first syndrome bit is equal to XOR (1, 0, 1, 0)=0; the second syndrome bit is equal to XOR (1, 0, 1, 0)=0; and the third syndrome bit is equal to XOR (0, 1, 1, 0)=0. Thus, no errors are detected in the balanced codeword 180, despite the inversion of the four bits (p1, p2, d2, d3) mapped to Packet 1. However, it should be appreciated that because the validity of the balanced codeword 180 has been maintained, the decoder is still able to detect an error that arises or is inserted in the balanced codeword 180 after the balancing process.

The state (e.g., threshold voltage) of a memory cell (which may be used to represent one or more data bits) may be determined based on the presence or absence (or magnitude) of a signal output by the memory cell (e.g., an output current, an output voltage) in response to an applied read voltage. For example, a memory cell may output current if the read voltage applied to the memory cell overcomes (e.g., has a larger magnitude than) the threshold voltage of the memory cell, and the memory cell may output no current (or a negligible amount of current) if the read voltage applied to the memory cell does not overcome (e.g., has a smaller magnitude than) the threshold voltage. So, the state of a memory cell may be written by setting the threshold voltage of the memory cell and may be determined by sensing a signal output by the memory cell in response to an applied read voltage.

But the threshold voltage of a memory cell may vary over time. For example, the threshold voltages of memory cells in the memory device 110 may drift (e.g., increase, decrease) as the memory device 110 operates, eventually reaching a point at which a fixed read voltage (or other read signal) results in an inaccurate reading of the memory cells. To compensate for threshold voltage drift and mitigate reliability issues that arise from such drift, the memory device 110 may implement a dynamic sensing technique that relies on the storage of balanced codewords (which may also be referred to as fixed-weight codewords).

In the ternary cell context, a balanced dataset may refer to a dataset that is associated with a pre-determined distribution (e.g., ratio) of logic values or programmable states. Put another way, a balanced dataset may be a dataset that, when stored in ternary cells, results in a predetermined ratio of ternary cells in each state. Thus, the balance of a dataset (e.g., a codeword, a sequence of data) may refer to the distribution of logic values or programmable states associated with the dataset. A balanced data set may also be referred to as a fixed-weight data set or other suitable terminology.

To appropriately balance a data set (e.g., a codeword) in the binary domain, the memory device 110 may map the bits in the codeword to packets and employ a balancing process in which the packets are inverted (e.g., one at a time) until a pre-determined weight has been achieved (e.g., until the codeword is balanced). If the quantity of bits mapped to a packet is one, the balancing process may be referred to as Knuth balancing. If the quantity of bits mapped to a packet is more than one, the balancing process may be referred to as a quantized-Knuth (QK) balancing process. A Knuth or quantized-Knuth balancing process may be applied in the binary domain (e.g., on data bits) or in the state domain (e.g., on states corresponding to the data bits).

To ensure that the original logic values of a balanced dataset (e.g., codeword, sequence of data) can be accurately recovered during a subsequent read operation, the memory device 110 may store balancing information bits (also referred to as balancing index bits, inversion pattern bits, or other suitable terminology) that indicate which packet(s) or states of the dataset were inverted during the balancing process. During a retrieval operation, the memory device 110 may reference the balancing information bits so that the memory device 110 can un-invert the proper packet(s) or states (e.g., those inverted during the balancing process) before the data bits from the dataset are returned to a requesting device.

Balancing datasets before storage may allow the memory device 110 to implement various techniques that improve operation of the memory device 110. For example, as noted above, the storage of balanced datasets may facilitate the use of a dynamic sensing technique that mitigates the negative effects of threshold voltage drift. According to the techniques described herein, the memory device 110 may generate balanced datasets for storage in ternary memory cells so that the memory device 110 can use a dynamic sensing technique to set a first read voltage and a second read voltage for ternary memory cells.

In one example that uses three codewords, the memory device 110 may divide a sequence of data into three sets of data bits (e.g., based on a coding scheme discussed in more detail herein). The coding scheme may be selected to minimize or reduce the quantity of ternary cells in a certain state that is undesirable (e.g., the most unreliable state, the most power consumptive state). The memory device 110 may balance a first codeword that includes the first set of data bits in the binary domain so that a target quantity of ternary cells have the undesired state. Using the first set of data bits (inclusive of the inverted data bits) from the first codeword, the second set of data bits, and the third set of data bits, the memory device 110 may convert the sequence of data into the state domain to balance the quantities of ternary cells in the other two states. The memory device 110 may then generate a second codeword that includes the second set of data bits and a third codeword that includes the third set of data bits so that the memory device 110 can store the sequence of data in ternary cells as three codewords (e.g., the first codeword, the second codeword, the third codeword).

During a retrieval operation, the memory device 110 may use the first codeword to determine (and set) the correct value for a first read voltage and may use the second codeword to determine (and set) the correct value for a second read voltage. Although described with reference to three codewords, the techniques described herein can be implemented using two codewords. Use of three codewords may allow the memory device 110 to lead with either polarity in opposite polarity sensing, whereas use of two codewords may simplify the storage and retrieval operations.

Figure 2:
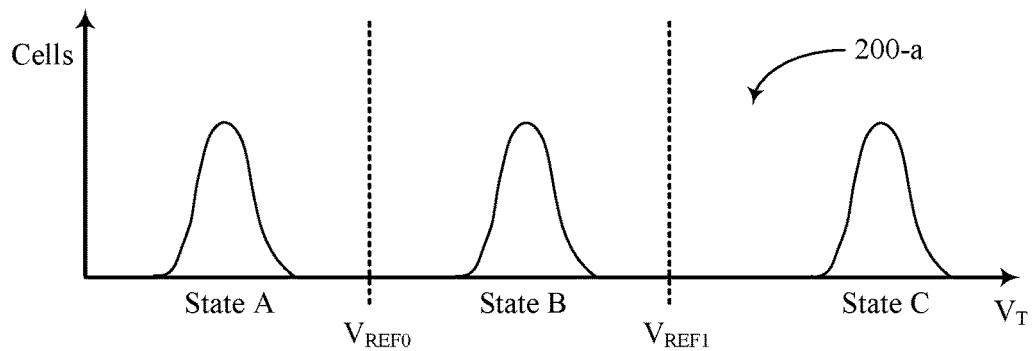
FIG. 2 illustrates example plots of state distribution curves that support balanced codewords for reducing a selected state in memory cells in accordance with examples as disclosed herein.
Figure 2:
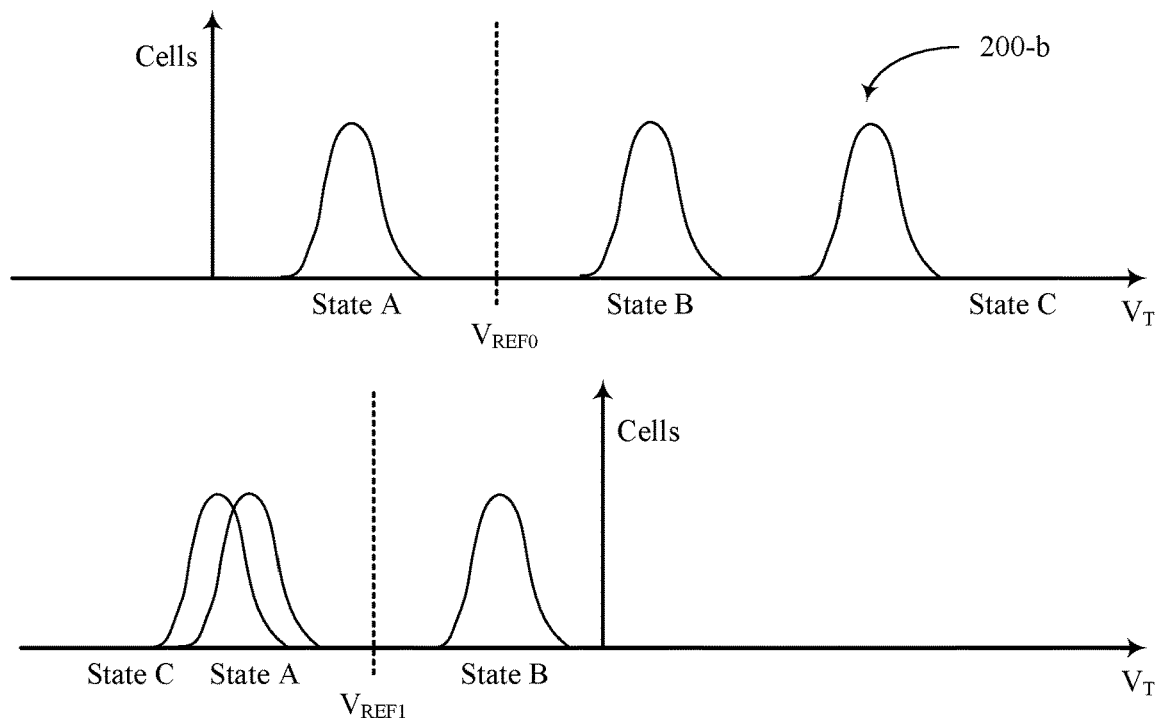

FIG. 2 illustrates example plots 200 of state distribution curves that support balanced codewords for reducing a selected state in memory cells in accordance with examples as disclosed herein. The plots 200 show possible distributions of threshold voltages for ternary memory cells that are programmable to three different states (e.g., threshold voltages): State A, State B, and State C. To determine (e.g., sense) the states of ternary memory cells, a memory device may use two read voltages. In a same polarity sensing technique, depicted with reference to plot 200-a, the read voltages may both be positive (or may both be negative). In an opposite polarity sensing technique, depicted with reference to plot 200-b, the first read voltage may be positive and the second read voltage may be negative (or vice versa). The techniques described herein allow a memory device to use either same polarity sensing or opposite polarity sensing, which may have different advantages and disadvantages.

For a set of ternary cells programmable to three states (e.g., State A, State B, State C), there may be a distribution curve for each state. For example, there may be a distribution curve for State A, a distribution curve for State B, and a distribution curve for State C. The area under a distribution curve may represent the total quantity of ternary cells programmed to that state, and each point along the distribution curve may represent the quantity of ternary cells with a particular threshold voltage (Vt). Although shown with equal quantities of State A, State B, and State C, the techniques described herein may be used by a memory device to reduce the quantity of cells in an undesirable state, which may improve the performance of the memory device.

In same polarity sensing, a memory device may use a first (e.g., positive) read voltage (denoted $V_{REF0}$) for sensing State A (e.g., for differentiating or distinguishing between State A and states other than State A). And the memory device may use a second (e.g., positive) read voltage (denoted $V_{REF1}$) for sensing State C (e.g., for differentiating or distinguishing between State C and states other than State C). Upon sensing State A and State C, the memory device may infer the memory cells in State B. The memory device may apply each read voltage to the memory cell and determine the state of the memory cell based on the output (or lack thereof) of the memory cell in response to the applied read voltage.

In opposite polarity sensing, a memory device may use a first (e.g., positive) read voltage (denoted $V_{REF0}$) for sensing State A and may use a second (e.g., negative) read voltage (denoted $V_{REF1}$) for sensing State B. Upon sensing State A and State B, the memory device may infer the memory cells in State C. The memory device may apply each read voltage to the memory cell and determine the state of the memory cell based on the output (or lack thereof) of the memory cell in response to the applied read voltage.

To compensate for threshold voltage drift, a memory device may set $V_{REF0}$ and $V_{REF1}$ using a dynamic sensing technique that relies on a balanced set of ternary cells, which may be associated with balanced codewords. The balanced codewords may be generated based on a target distribution of states and a coding scheme that maps three bits to two ternary cells. A target distribution may define a target quantity for one or more states (e.g., a target quantity for State A, a target quantity for State B, a target quantity for State C).

To implement the dynamic sensing technique for same polarity sensing, the memory device may incrementally increase (e.g., during a series of read operations) the level of the read voltage applied to set of ternary cells until the quantity of ternary cells determined to be in State A is equal to the target distribution for State A. Once the target distribution of ternary cells in State A is detected, the memory device may determine that the associated value for the read voltage is the correct value and may set the level of $V_{REF0}$ to that value. A similar process may be used to set the level of $V_{REF1}$ based on the quantity of ternary cells in State B.

To implement the dynamic sensing technique for opposite polarity sensing, the memory device may incrementally increase (e.g., during a series of read operations) the level of the read voltage applied to set of ternary cells until the quantity of ternary cells in State A is determined to be equal to the target distribution for State A. Once the target distribution of ternary cells in State A is detected, the memory device may determine that the associated value for the read voltage is the correct value and may set the level of $V_{REF0}$ to that value. A similar process may be used to set the level of $V_{REF1}$ except that the level of the read voltage may be incrementally decreased (e.g., during a series of read operations) until the quantity of ternary cells in State B is equal to the target distribution. The process of setting the read voltages (e.g., $V_{REF0}$ and $V_{REF1}$) to the correct values and using the correct values to read the ternary cells may be referred to herein as a retrieval process. Within a retrieval process, each individual sensing operation may be referred to as a read operation.

Although described with reference to setting $V_{REF1}$ after $V_{REF0}$, $V_{REF0}$ may be set after $V_{REF1}$ is set. In such a scenario, the memory device may implement the dynamic sensing technique by incrementally decreasing (e.g., during a series of read operations) the level of the read voltage applied to set of ternary cells until the quantity of ternary cells in State B is determined to be equal to the target distribution for State B. Once the target distribution of ternary cells in State B is detected, the memory device may determine that the associated value for the read voltage is the correct value and may set the level of $V_{REF1}$ to that value. A similar process may be used to set the level of $V_{REF0}$ except that the level of the read voltage may be incrementally increased (e.g., during a series of read operations) until the quantity of ternary cells in State A is equal to the target distribution.

But in some examples, the selected levels for $V_{REF0}$ and $V_{REF1}$ may be imprecise if one or more of the ternary cells has an error. For example, if a ternary cell drifts from State B to State A, the memory device may incorrectly set $V_{REF0}$.

The techniques described herein may allow the memory device to further refine the levels of $V_{REF0}$ and $V_{REF1}$ based on any errors detected in the ternary cells. Specifically, the memory device may process a sequence of data bits for storage as described herein so that error detection can be performed after reading at $V_{REF0}$ as well as after reading at $V_{REF1}$. For example, the memory device may generate codewords that not only have balanced states (e.g., a target distribution of State A, state B, and State C) but that also provide syndrome feedback when the ternary cells are read at $V_{REF0}$ and $V_{REF1}$. If the syndrome feedback provided at $V_{REF0}$ indicates an error in the associated codeword, the memory device may correct the error and adjust $V_{REF0}$ accordingly or implement corrective steps. Similarly, if the syndrome feedback provided at $V_{REF1}$ indicates an error in the associated codeword, the memory device may correct the error and adjust $V_{REF1}$ accordingly or implement corrective steps.

Thus, the techniques described herein may allow a memory device to precisely set read voltages for ternary cells, which may be particularly useful in scenarios where read operations are destructive. A destructive read operation may refer to read operation that changes the state of memory cell, a phenomenon which may occur if the level of the read voltage is too high. For example, if $V_{REF0}$ is inadvertently set above the lower threshold voltages of ternary cells in State B (e.g., if $V_{REF0}$ crosses the State B distribution curve), those cells may change from State B to State A, resulting in errors. So, memory technologies that feature destructive read operations may benefit from the techniques described herein that allow for read voltages to be set precisely, even in the presence of data errors.

In some examples, it may be advantageous for a memory device using opposite polarity sensing to switch between leading with the positive polarity and the negative polarity for the first read operation. For example, it may be advantageous for the memory device to read using $V_{REF0}$ first in some scenarios and read using $V_{REF1}$ first in other scenarios. To support such flexibility, the memory device may use three codewords as described herein (as opposed to using two codewords, which may be simpler).

Although described with reference to ternary memory cells that are programmable to three states, the techniques described herein may be implemented using other types of memory cells that are programmable to other, different quantities of states.

Figure 3:
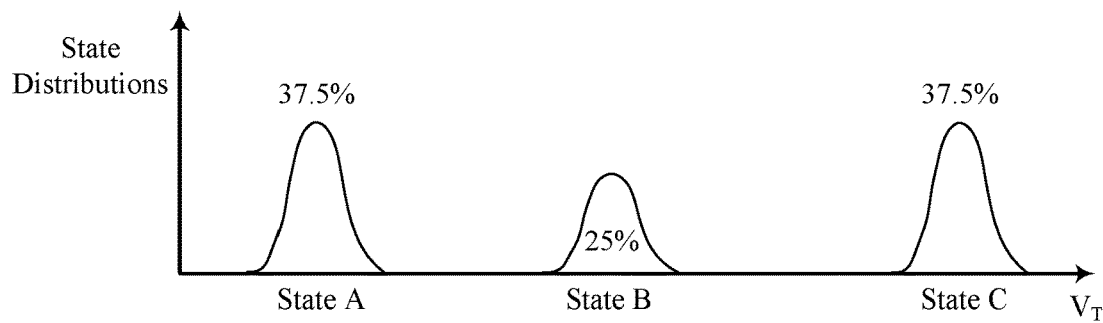
FIG. 3 illustrates examples of coding schemes that support balanced codewords for reducing a selected state in memory cells in accordance with examples as disclosed herein.
Figure 3:
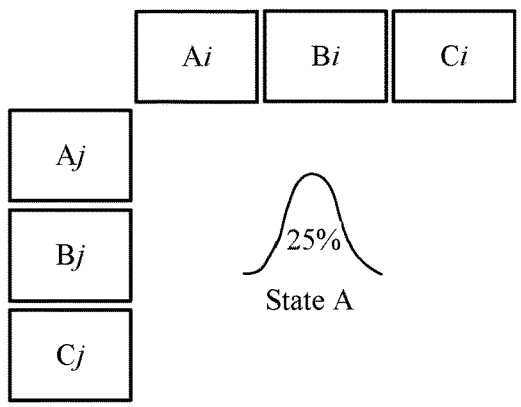
Figure 3:
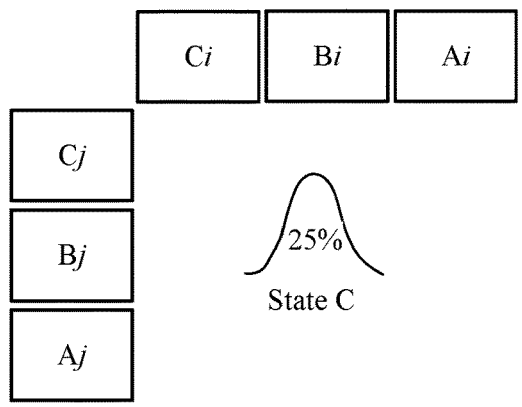

FIG. 3 illustrates examples of coding schemes 300 that support balanced codewords for reducing a selected state in memory cells in accordance with examples as disclosed herein. The coding schemes 300 may map multiple data bits (e.g., three data bits) to two ternary cells (e.g., denoted cell i and cell j). For ease of reference, the three data bits are denoted x, y, and z. The x-bit may be in the most significant bit position, the y-bit may be in the intermediate bit position, and the z-bit may be in the least significant bit position. Use of coding scheme 300-$a$ may allow a memory device to reduce (relative to State B and State C) the quantity of ternary cells in State A. Use of coding scheme 300-$b$ may allow a memory device to reduce (relative to State A and State C) the quantity of ternary cells in State B. And use of coding scheme 300-$b$ may allow a memory device to reduce (relative to State A and State B) the quantity of ternary cells in State C. A coding scheme may also be referred to as a coding table or other suitable terminology.

For brevity only coding scheme 300-$b$ is described. However, one skilled in the art would understand how the characteristics and concepts described with reference to coding scheme 300-$b$ can be extended (with appropriate modifications) to coding scheme 300-$a$ and coding scheme 300-$c$, which may be similar to coding scheme 300-$b$ except that the states in the columns and rows are switched as shown.

According to the coding scheme 300-$b$, the eight possible logic value combination of three bits (x, y, z) may be mapped to eight of the nine possible state combinations of cell i and cell j. In FIG. 3, the states of cell i are denoted Ai, Bi, and Ci, the states of cell j are denoted Aj, Bj, and Cj, and each box represents a corresponding combination of logic values for the (x, y, z) bits. The combination of states (Bi, Bj) is not used in the coding scheme 300-*b*, which may allow the memory device to reduce (relative to State A and State C) the quantity of ternary cells in State B.

The coding scheme 300-*b* links State A to the y-bit value such that the logic value of the y-bit is given by the even/odd parity of the ternary cells in State A. For example, if zero or two of the ternary cells are in State A, the y-bit logic value is 0. If one of the ternary cells is in State A, the y-bit logic value is 1. By linking State A to the y-bit value, the coding scheme 300-*b* may allow the memory device to balance the states associated with a sequence of data bits in the state domain (e.g., by switching State A and State C). Because State A is detected using $V_{REF0}$, such a mapping may enable syndrome feedback for a codeword at $V_{REF0}$ (e.g., if the codeword's data bits are exclusively y-bits).

The coding scheme 300-*b* links State B to the x-bit value such that the logic value of the x-bit is given by the quantity of ternary cells in State B. For example, if none of the ternary cells is in State A, the x-bit logic value is 0. If one of the ternary cells is in State B, the x-bit logic value is 1. By linking State B to the x-bit value, the coding scheme 300-*b* may allow the memory device to balance the states associated with a sequence of data bits in the binary domain (e.g., by inverting x-bits). Because State B is detected using $V_{REF1}$, such a mapping may enable syndrome feedback for a codeword at $V_{REF1}$ (e.g., if the codeword's data bits are exclusively x-bits, or exclusively x-bit and z-bits).

As noted, use of coding scheme 300-*b* may allow a memory device to reduce (relative to State A and State C) the quantity of ternary cells in State B. For example, as described herein and with reference to FIGS. 4A and 4B, use of the coding scheme 300-*b* may allow the memory device to represent a sequence of data bits by writing 37.5% of the ternary memory cells to State A, writing 25% of the ternary cells to State B, and writing 37.5% of the ternary cells to State C. To reduce the quantity of ternary cells in State A, the memory device may select and use coding scheme 300-*a*. To reduce the quantity of ternary cells in State C, the memory device may select and use coding scheme 300-*c*. So, the memory device may select a coding scheme from the coding schemes 300 based on the target ratios for State A, State B, and State C.

Other examples of the coding schemes 300 are contemplated and within the scope of the present disclosure. For example, coding scheme 300-*a* may support a positive polarity-first dynamic sensing scheme, whereas a coding scheme similar to coding scheme 300-*a* but with the State B and State C positions switched may support a dynamic sensing scheme where the first polarity for reading is dynamically selected. As another example, coding scheme 300-*b* may support a dynamic sensing scheme where the first polarity for reading is dynamically selected, whereas a coding scheme similar to coding scheme 300-*b* but with the State A and State C positions switched may support a negative polarity-first dynamic sensing scheme. As another example, coding scheme 300-*c* may support a positive polarity-first dynamic sensing scheme, whereas a coding scheme similar to coding scheme 300-*c* but with the State A and State B positions switched may support a negative polarity-first dynamic sensing scheme. Accordingly, in some examples, a memory device may select a coding scheme based on the polarity of the read voltages.

So, although the coding scheme 300-*b* provides an example mapping of bit logic value combinations to combinations of ternary cell states—which may be associated with various advantages—other coding schemes with suitable mappings may be used implement the techniques described herein.

Figure 4A:
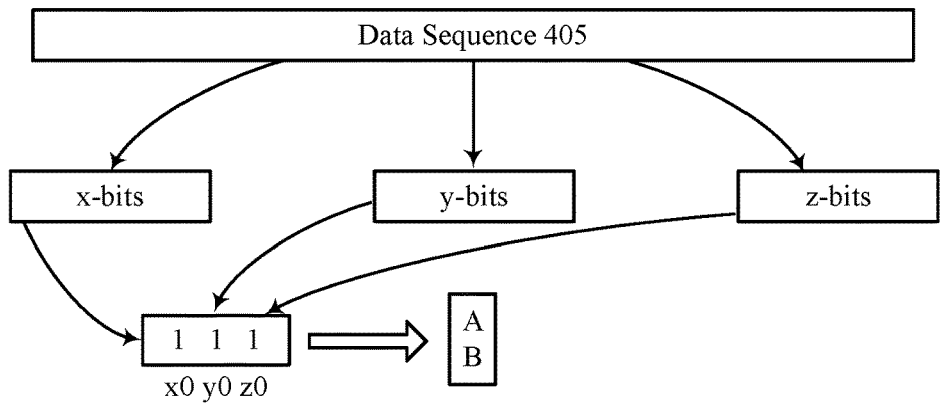
FIGS. 4A and 4B illustrate an example of a storage process that supports balanced codewords for reducing a selected state in memory cells in accordance with examples as disclosed herein.
Figure 4A:
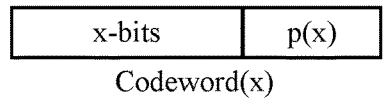
Figure 4A:
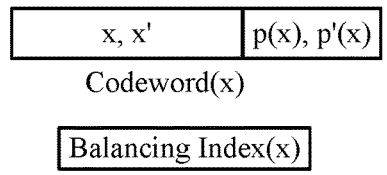
Figure 4A:
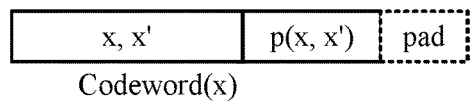
Figure 4A:
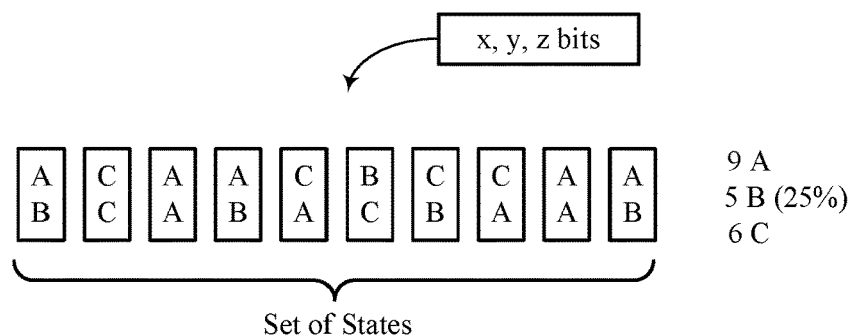
Figure 4B:
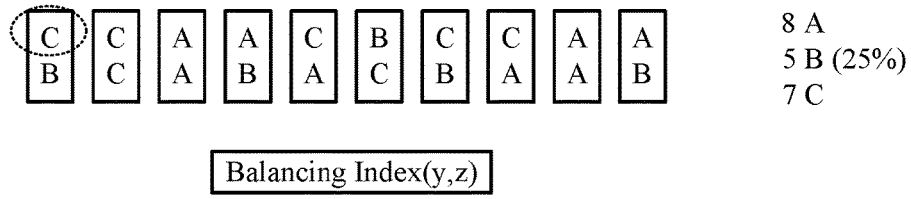
Figure 4B:
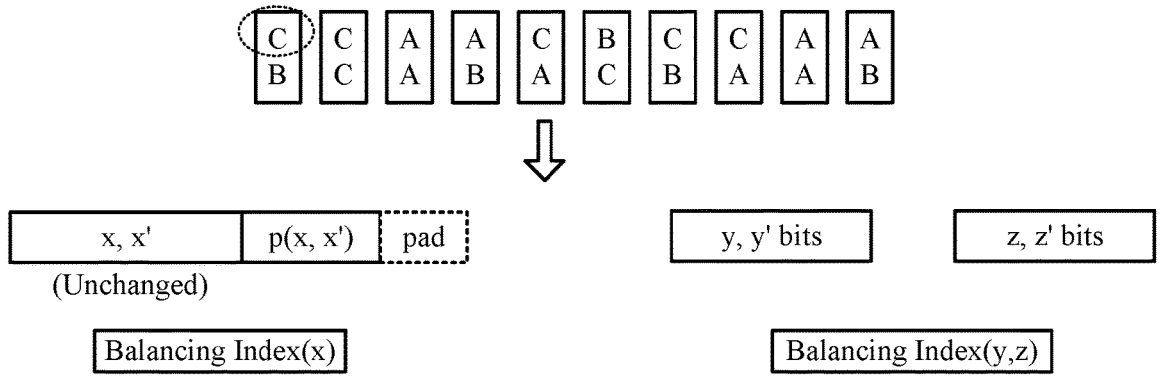
Figure 4B:
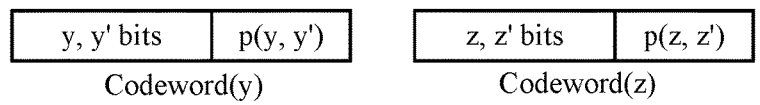
Figure 4B:
Figure 4B:
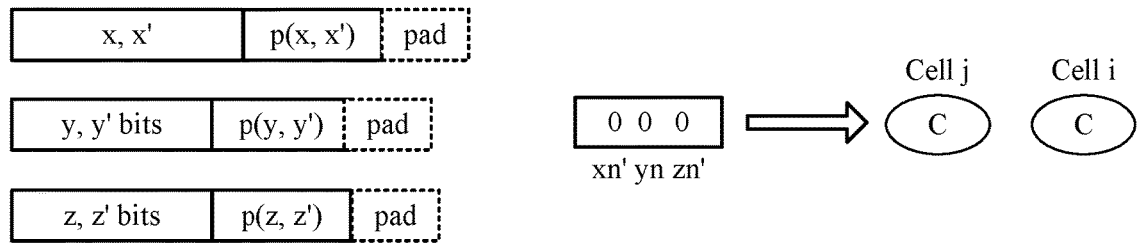
Figure 4B:
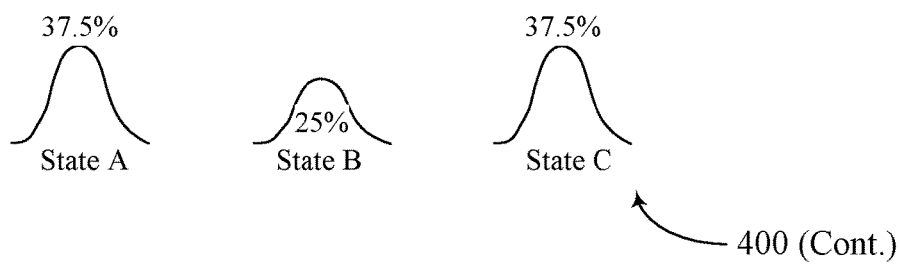

FIGS. 4A and 4B illustrates an example of a storage process 400 that supports balanced codewords for reducing a selected state in memory cells in accordance with examples as disclosed herein. A memory device may implement the storage process 400 to generate multiple codewords (e.g., codeword(x), codeword(y), codeword(z), or codeword(x) and codeword(y,z)) that enable a dynamic sensing technique as described herein. FIG. 4A illustrates a first stage of the storage process 400 and FIG. 4B illustrates a second stage of the storage process 400.

The memory device may receive a sequence of data bits 405 for storage in an array of cells (e.g., an array of ternary cells). The memory device may divide (e.g., logically or physically) the data bits 405 into combinations of (x, y, z) bits for mapping to respective pairs of ternary cells according to a coding scheme such as the coding scheme 300-*b*. Put another way, the memory device may assign the data bits 405 to groups of x-bits, y-bits, and z-bits. Each combination of (x, y, z) bits may be mapped to a corresponding pair of ternary cell states based on coding scheme 300-*b*. For instance, if (x0, y0, z0)=(1, 1, 1), the combination of (x0, y0, z0) may be mapped to State A (cell j) and State B (cell i). In some examples, the memory device may select the coding scheme based on the state the memory device has determined to reduce relative to the other states.

Although shown divided into three sets of data bits, the techniques described herein may be implemented by dividing the sequence of data 405 into two sets of data bits. In such an example, the sequence of data 405 may be divided into a first set of data bits made up of x-bits and a second set of data bits made up of y-bits and z-bits.

After dividing the sequence of data 405 into sets of bits, the memory device may generate a codeword from the set of x-bits. For example, the memory device may (e.g., via ECC encoding) generate parity bits (denoted p) based on the set of x-bits and may combine the parity bits and the set of x-bits into a codeword (e.g., codeword(x)). Because the bits in codeword(x) can be detected using $V_{REF1}$ (due to the coding scheme 300-*b*, which links the x-bit to State B, which is sensed via $V_{REF1}$), the memory device may use codeword(x) to detect errors when $V_{REF1}$ is used to read the ternary cells, which in turn may allow the memory device to select a more precise value for $V_{REF1}$ compared to other techniques. To ensure syndrome bits for codeword(x) after sensing at $V_{REF1}$ (and to comply with the coding scheme 300-*b*, which uses two ternary cells to store three bits), each parity bit for codeword(x) may be considered as an x-bit for encoding purposes and a corresponding y-bit and z-bit may be added to the sets of y-bits and z-bits (which are balanced later in the process).

After generating codeword(x), the memory device may balance codeword(x) in the binary domain to reach a target distribution of ternary cells in State B (which is linked to the x-bit). For example, the memory device may invert (e.g., using Knuth or quantized-Knuth balancing) one or more of the x-bits in codeword(x) to reach a target distribution of logic values (e.g., 50% 1s, 50% 0s) associated with an overall target distribution of State B for the sequence of data (e.g., 25% State B). After the balancing process, codeword (x) may include one or more inverted x-bits (denoted x') and/or one or more inverted parity bits (denoted p').

As a simple example of balancing the x-bit in the binary domain, consider a data sequence [x0, y0, z0, x1, y1, z1]=[0 1 1 0 1 1]. In this data sequence, the x-bit is unbalanced (e.g.,

[x0 x1]=[0 0]) and the corresponding combinations of states are [A C] (because [x0 y0 z0]=[0 1 1]) and [A C] (because [x1 y1 z1]=[0 1 1]). By inverting x0 (denoted x0'), the data sequence becomes [x0' y0, z0, x1, y1, z1]=[1 1 1 0 1 1]. In this data sequence, the x-bit is balanced (e.g., [x0' x1]=[1 0]) and the corresponding combination of ternary states is [A B] (because [x0' y0 z0]=[1 1 1]) and [A C] (because [x1 y1 z1]=[0 1 1]). So, by using coding scheme 300-b, the memory device may reach a target distribution of ternary cells in State B (e.g., 25%) by inverting the x-bits in the binary domain to reach a target distribution of logic values (e.g., 50% 1s, 50% 0s).

To prevent ECC disruption that may otherwise occur due to the balancing process, the memory device may map the bits of codeword(x) (e.g., the x-bits, the parity bits) to packets in a manner such that inversion of one or more of the packets during the balancing process (which operates on the packets) does not negate the validity of the codeword. Each packet may include one bit (e.g., in Knuth balancing) or multiple bits (e.g., in quantized-Knuth balancing). Thus, as described with reference to FIG. 1, ECC decoding may still function to detect an error in codeword(x) even if one or more of the packets of codeword(s) are inverted as part of the balancing process that occurs after ECC encoding.

To enable recovery of the original logic values of the bits in codeword(x) (potentially modified during the balancing process), the memory device may use balancing information bits (denoted balancing index(x)) that indicate which packets of codeword(x) were inverted during the balancing process (referred to as the balancing pattern or the inversion pattern). So, after reading codeword(x) from memory, the memory device may reference the balancing index(x) to determine which packet(s) of codeword(x) to re-invert to recover the original logic values for the bits in codeword(x).

In some examples, the encoding scheme used for the balancing information bits of balancing index(x) may be selected so that the x-bit(s) of the balancing index(x) are logic zero (so as not to disrupt the State B balance). That is, the balancing pattern for codeword(x) may be represented by the logic values of the y-bit(s) and z-bit(s) of the balancing index(x) (because the states associated with these bit positions can be balanced in the state domain later in the process). In other examples, the encoding scheme for the balancing information bits of balancing index(x) may permit the x-bit(s) of the balancing index(x) to have non-zero logic values. In such a scenario, any State B imbalance that results from the addition of the balancing index(x) may be compensated for via padding bits.

After balancing codeword(x), the memory device may add one or more padding bits (denoted pad) to codeword(x) to further refine the balance of codeword(x) (e.g., to reach the target distribution for State B). For example, if less than (or more than) 50% of the states associated with codeword (x) are State B (which translates to 25% of the states associated with the sequence of data), the memory device may add an appropriate quantity of padding bits to resolve the difference between the target quantity for State B and the actual quantity for State B.

In some examples, the padding bits may compensate for a State B imbalance caused by the balancing index(x). For example, if the balancing index(x) includes three balancing information bits (e.g., xi, yi, zi) associated with states [A, C], the memory device may add three padding bits associated with states [B A] or [B C] so that between the codeword(x), the balancing index(x), and the padding bits, 50% of the states associated with codeword(x) are State B (which translates to 25% of the states associated with the sequence of data being State B). In any event, the x-bit(s) from the padding bits may be appended to codeword(x), the y-bit(s) from the padding bits may be added to the set of y-bits, and the z-bit(s) from the padding bits may be added to the set of z-bits.

After balancing codeword(x) in the binary domain, the memory device may balance the y-bits and the z-bits in the binary domain or may balance State A and State C in the state domain. If the memory device balances the y-bits and the z-bits in the binary domain, the memory device may do so by trying all possible inversion combinations for the y-bits and the z-bits until a target ratio of State A and State C is reached. In such a scenario, there may be a balancing index for the y-bits and a separate balancing index for the z-bits. Although associated with various benefits, balancing the y-bits and the z-bits in the binary domain may be more complex, time consuming, and use more balancing information bits that balancing State A and State C in the state domain.

To balancing State A and State C in the state domain, the memory device may use the coding scheme 300-b to convert the x-bits, the y-bits, and the z-bits into a set of states. It should be appreciated that the x-bits may include the set of x-bits from the sequence of data (after balancing codeword (x)), the x-bits from the parity bits for codeword(x), the x-bits from the balancing index(x), and/or the x-bits from the padding bits for codeword(x). The y-bits may include the set of y-bits from the sequence of data bits as well as any y-bits corresponding to: balancing index(x), parity bits for codeword(x), or padding bits for codeword(x). Similarly, the z-bits may include the set of z-bits from the sequence of data bits as well as any z-bits corresponding to: balancing index (x), parity bits for codeword(x), or padding bits for codeword(x). As an illustration, the memory device may convert the x-bits, the y-bits, and the z-bits into a set of states that includes nine A States, five B States (equal to 25% of the total quantity of states), and 6 C States. So, in the given example, there may be an imbalance between State A and State C.

Proceeding to FIG. 4B, the memory device may balance the A/C States in the state domain. To do so, the memory device may use Knuth or quantized Knuth balancing to change states according to an inversion scheme (e.g., inversion scheme 1, inversion scheme 2) until a target ratio of State A and State C is reached (or until target quantities of State A and State C have been reached).

| Inversion Scheme 1 | |
| --- | --- |
| Initial State | Final State |
| A | C |
| C | A |

| Inversion Scheme 2 | |
| --- | --- |
| Initial State | Final State |
| A | C |
| C | A |
| B | B |

If the memory device uses inversion scheme 1, the memory device may proceed through the set of states one at a time changing State A to State C and changing State C to State A until a target ratio of State A and State C has been reached (or until target quantities of State A and State C have been reached). For example, starting with the first state in the set of states, the memory device may change State A to be State C (highlighted via a dashed ellipse). After changing the first state from State A to State C, there may be eight A States, five B States, and 7 C states. Put another way the distribution of states may be 40% State A, 25% State B, and 35% State C. So, the distribution of states may be as close to the target distribution as possible given the total quantity of states in the example.

After balancing the set of states using the inversion scheme, the memory device may determine balancing information bits (denoted balancing index(y,z)) that indicate which states of the set of states were changed during the balancing process (referred to as the balancing pattern or the inversion pattern). In some examples, the balancing index (y,z) may indicate the total quantity of changed states. For example, if the balancing index(y,z) indicates that four states were changed, the memory device may know (due to Knuth/quantized Knuth balancing) that the first four A/C states were changed.

Inversion scheme 2 may be similar to inversion scheme 1 except that the memory device may "change" state B to state B and may account for the change via the balancing index (y,z) (which may indicate the total quantity of "changed" states, as opposed to the quantity of changed A/C states). So, inversion scheme 2 may use more balancing information bits than inversion scheme 2 (because State B "changes" are also tracked) with the advantage of improved reliability (e.g., lowering the bit error rate (BER)). For example, if a State B erroneously switches to State A (or State C), the balancing index(y,z) from inversion scheme 2 may still be correct during unbalancing (unlike the balancing index(y,z) from inversion scheme 1, which only counts A/C States), so the memory device may still be able to unbalance the set of states.

In some examples, the encoding scheme used for the balancing information bits of balancing index(y,z) may be selected so that the x-bit(s) of the balancing index(y,z) are logic zero (so as not to disrupt the State B balance). That is, the balancing pattern for the set of states may be represented by the logic values of the y-bit(s) and z-bit(s) of the balancing index(y,z) (because the states associated with these bit positions can be balanced via padding bits later in the process).

After balancing the set of states, the memory device may convert (e.g., using the coding scheme 300-b) the set of states into the binary domain. So, the memory device may have codeword(x) (potentially with one or more padding bits) and balancing index(x), a set of y-bits (which includes uninverted y-bits and inverted y-bits, denoted y', that correspond to A/C state changes), a set of z-bits (which includes uninverted z-bits and inverted z-bits, denoted z', that correspond to A/C state changes), as well as the balancing index(y,z).

After converting the set of states into the binary domain, the memory device may generate one or more codewords from the set of y-bits and z-bits. For instance, in a three codeword example, the memory device may generate codeword(y) from the y-bits and may generate codeword(z) from the z-bits, resulting in codeword(x), codeword(y), and codeword(z). The codeword(y) may include parity bits that are based on the y-bits. The codeword(z) may include parity bits that are based on the z-bits. In an alternative two codeword example, the memory device may generate codeword(y,z) from the y-bits and the z-bits, resulting codeword(x) and codeword(y,z). In such an example, the codeword(y,z) may include parity bits that are based on the y-bits and the z-bits.

After generating the codewords, the memory device may add one or more padding bits (denoted pad) to refine or further balance State A and State C (which may become unbalanced after generating codeword(y) and codeword(z)). The padding bits may include one or more combinations of (x, y, z) bits where the x-bit(s) are set to logic 0 so as not to disturb the quantity of State B. In the three codeword example, the x-bit(s) from the padding bits may be appended to codeword(x), the y-bits from the padding bits may be appended to codeword(y), and the z-bits from the padding bits may be appended to codeword(z). In the two codeword example, the x-bit(s) from the padding bits may be appended to codeword(x) and the y-bits and z-bits from the padding bits may be appended to codeword(y,z).

After potentially adding padding bits, the memory device may write the codewords (and potentially the padding bits and/or one or both of the balancing indices) to a set of ternary memory cells based on the coding scheme 300-b. For example, to write (xn' yn' zn') (which includes the nth x-bit from codeword(x), the nth y-bit from codeword(y), and the nth z-bit from codeword(z)) to a pair of ternary cells (cell j, cell i), the memory device may set the threshold voltages to cell j and cell i to state [C C], assuming xn'=0, y0'=0, z0'=0. And so on and so forth for the other bits in the codewords. Due to the balancing operations of the storage process 400, the set of ternary memory cells used to store the codewords may have a target distribution (e.g., ratio) of states that enables a dynamic sensing scheme. For example, 37.5% of the ternary cells in the set may have State A, 25% of the ternary cells in the set may have State B, and 37.5% of the ternary cells in the set may have State C.

Thus, a memory device may implement the storage process 400 to generate multiple codewords (e.g., codeword(x), codeword(y), codeword(z)) that enable a dynamic sensing technique as described herein.

Figure 5:
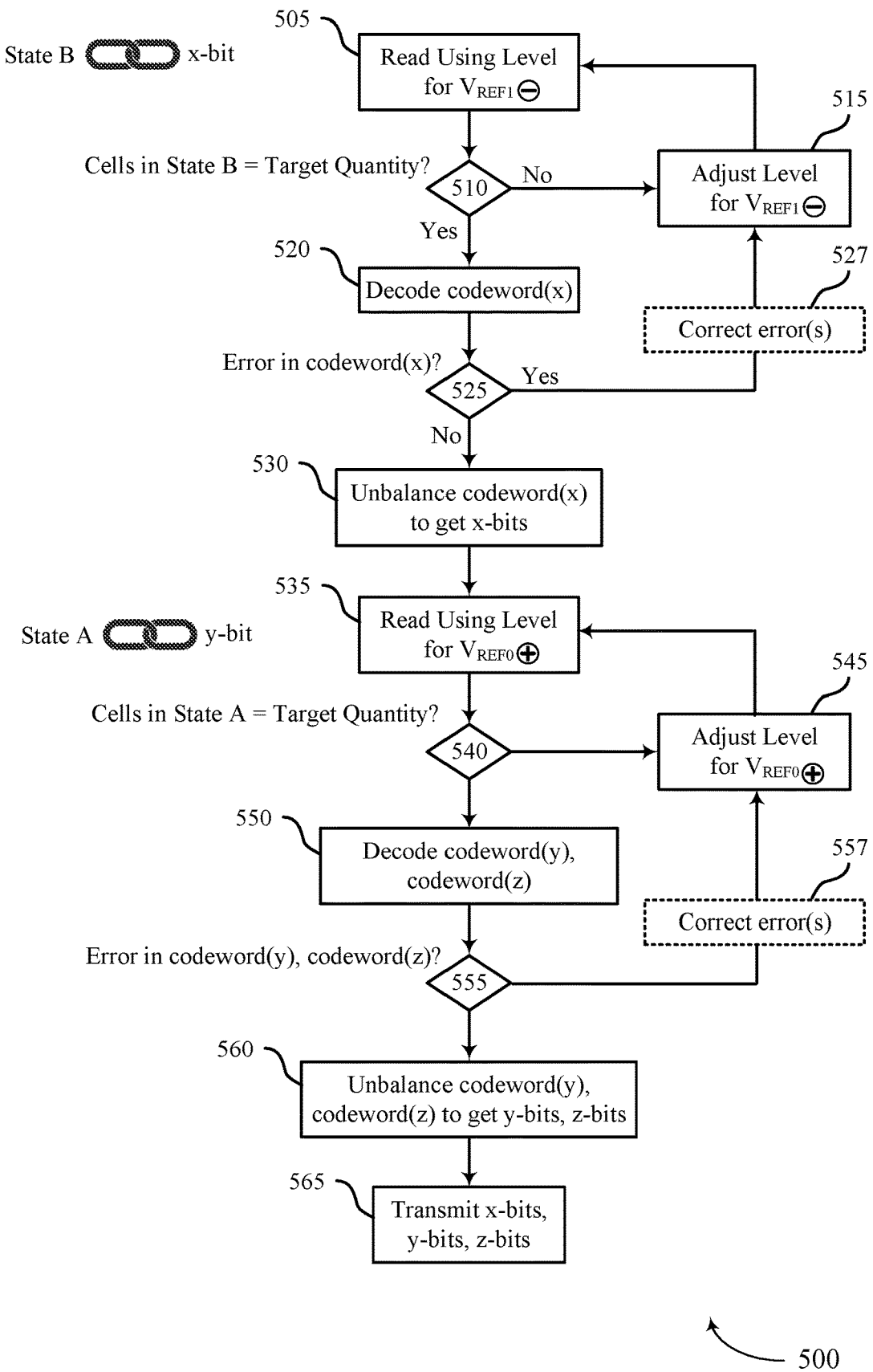
FIG. 5 illustrates an example of a retrieval process that supports balanced codewords for reducing a selected state in memory cells in accordance with examples as disclosed herein.

FIG. 5 illustrates an example of a retrieval process 500 that supports balanced codewords for reducing a selected state in memory cells in accordance with examples as disclosed herein. A memory device may implement the retrieval process 500 to read multiple codewords (e.g., codeword(x), codeword(y), codeword(z), or codeword(x) and codeword(y,z)) that enable a dynamic sensing technique as described herein. For example, the retrieval process 500 may be performed using codewords generated according to the storage process 400. FIG. 5 illustrates use of opposite polarity sensing with the dynamic sensing technique, where the first read voltage is negative (e.g., $V_{REF1=Negative}$) and the second read voltage is positive (e.g., $V_{REF0=Positive}$). That is, the retrieval process 500 may be an example of a negative polarity-first dynamic sensing scheme. The memory device may implement the retrieval process 500 in response to a request from another device (e.g., a host device) for data stored at the memory device (e.g., the sequence of data bits 405).

At 505, the memory device may read a set of ternary cells that stores codeword(x), codeword(y), and codeword(z) (or codeword(x) and codeword(y,z)). The memory device may read the set of ternary cells using a negative level for a first read voltage (e.g., $V_{REF1=Negative}$) that is for sensing State B. For example, the memory device may apply $V_{REF1=Negative}$ to the set of ternary cells. The memory device may determine how many ternary cells are in State B based on reading the set of ternary cells using $V_{REF1=Negative}$. Per the coding scheme 300-b, State B is linked directly to the x-bit, so sensing State B allows the memory device to read codeword (x).

At 510, the memory device may determine whether the quantity of ternary cells in State B is equal to the target quantity for State B (e.g., as defined by the target distribution of states). The memory device may determine whether the quantity of ternary cells in State B is equal to the target quantity for State B by comparing the quantity of ternary cells in State B with the target quantity for State B. Alternatively, the memory device may determine whether the ratio of ternary cells in State B (relative to the total quantity of states) is equal to the target ratio for State B.

If, at 510, the quantity of ternary cells in State B is determined to be different (e.g., less than) than the target quantity for State B, the memory device may proceed to 515 and adjust the level for the first read voltage (e.g., the memory device may decrease $V_{REF1=Negative}$). The memory device may then repeat the operations at 505 and 510 using the adjusted level for $V_{REF1=Negative}$. If, at 510, the quantity of ternary cells in State B is determined to be equal to the target quantity for State B, the memory device select the level as the correct level for the first read voltage $V_{REF1=Negative}$ and proceed to 520.

At 520, the memory device may perform ECC decoding to detect any errors in codeword(x). For example, the memory device may perform ECC decoding using syndrome bits that are based on the codeword(x) and the Hamming matrix (e.g., ECC code) used to generate codeword(x). At 525, the memory device may determine whether any errors were detected in codeword(x). If the memory device detects one or more errors in codeword(x) at 525, the memory device may correct the error(s) at 527 before proceeding to 515 (where the memory device may adjust the level for $V_{REF1=Negative}$ based on the error(s) in codeword(x)).

If the memory device detects no errors in codeword(x) at 525, the memory device may proceed to 530 and unbalance codeword(x) to obtain the original logic values for the x-bits. Unbalancing a codeword may refer to the inversion of one or more packets of the codeword to restore the original logic values of the bits in those packets. In some examples, the memory device may unbalance codeword(x) based on balancing information bits (e.g., balancing index(x)) that indicate the packets of codeword(x) that were inverted as part of balancing during the storage process. Although shown occurring before 535, the memory device wait until later in the process (e.g., after setting the correct value for $V_{REF0}$=Positive, at 560) to unbalance codeword(x) (e.g., because some of the balancing information bits in balancing index(x) may be y-bits and/or z-bits that are determined based on $V_{REF0=Positive}$).

At 535, the memory device may read the set of ternary cells that stores codeword(x), codeword(y), and codeword (z) (or codeword(x) and codeword(y,z)). The memory device may read the set of ternary cells using a positive level for a second read voltage (e.g., $V_{REF0=Positive}$) that is for sensing State A. For example, the memory device may apply $V_{REF0=Positive}$ to the set of ternary cells. The memory device may determine how many ternary cells are in State A based on reading the set of ternary cells using $V_{REF0=Positive}$. Per the coding scheme 300-b, State A is linked directly to the y-bit, so sensing State A allows the memory device to read codeword(y) (and thus codeword(z) or codeword(y,z)).

At 540, the memory device may determine whether the quantity of ternary cells in State A is equal to the target quantity for State A (e.g., as defined by the target distribution of states). The memory device may determine whether the quantity of ternary cells in State A is equal to the target quantity for State A by comparing the quantity of ternary cells in State A with the target quantity for State A. Alternatively, the memory device may determine whether the ratio of ternary cells in State A (relative to the total quantity of states) is equal to the target ratio for State A.

If, at 540, the quantity of ternary cells in State A is determined to be different (e.g., less than) than the target quantity for State A, the memory device may proceed to 545 and adjust the level for the second read voltage (e.g., the memory device may increase $V_{REF0=Positive}$). The memory device may then repeat the operations at 535 and 540 using the adjusted level for $V_{REF0=Positive}$. If, at 540, the quantity of ternary cells in State A is determined to be equal to the target quantity for State A, the memory device select the level as the correct level for the second read voltage $V_{REF0=Positive}$ and proceed to 550.

At 550, the memory device may perform ECC decoding to detect any errors in codeword(y) and/or codeword(z) (or codeword(y,z)). For example, the memory device may perform ECC decoding using syndrome bits that are based on the codeword(y), codeword(z), (or codeword(y,z)) and the Hamming matrix used to generate the codewords. At 555, the memory device may determine whether any errors were detected in codeword(y) or codeword(z) (or codeword(y,z)). If the memory device detects one or more errors in the codeword(s) at 555, the memory device may correct the error(s) at 557 before proceeding to 545 (where the memory device may adjust the level for $V_{REF0=Positive}$ based on the error(s) in the codeword(s)).

If the memory device detects no errors in the codeword(s) at 555, the memory device may proceed to 560 and unbalance codeword(y) and codeword(z) (or codeword(y,z)) to obtain the original logic values for the y-bits and the z-bits. In some examples (e.g., if balancing occurred in the state domain), the memory device may unbalance codeword(y) and codeword(z) (or codeword(y,z)) in the state domain. For example, the memory device may use the coding scheme 300-b to convert the x-bits, y-bits, and z-bits into a set of states that the memory device then unbalances based on the balancing index(y,z). Unbalancing in the state domain may refer to the changing of one or more states using an inversion scheme (e.g., inversion scheme 1, inversion scheme 2) to restore the original states. In other examples (e.g., if balancing occurred in the binary domain), the memory device may unbalance codeword(y) and codeword(z) (or codeword (y,z)) in the binary domain.

So, the memory device may recover the original sets of x-bits, y-bits, and z-bits. Accordingly, at 565, the memory device may return (e.g., communicate) the sequence of data bits 405 to the requesting device.

Thus, the memory device may use a dynamic sensing technique—and multiple codewords—to set correct levels for $V_{REF0}$ and $V_{REF1}$. The use of three codewords (and coding scheme 300-b) may allow the memory device to arbitrarily select the polarity of the first read voltage. For example, after reading the sequence of data bits 405 from a set of ternary cells using $V_{REF1=Negative}$ as the first read voltage, the memory device may read a second sequence of data bits (e.g., as codewords) from a second set of ternary cells using $V_{REF0=Positive}$ as the (temporally) first read voltage. An example of a positive polarity-first dynamic sensing scheme is described with reference to FIG. 6 (which may be enabled by, e.g., coding scheme 300-b).

Figure 6:
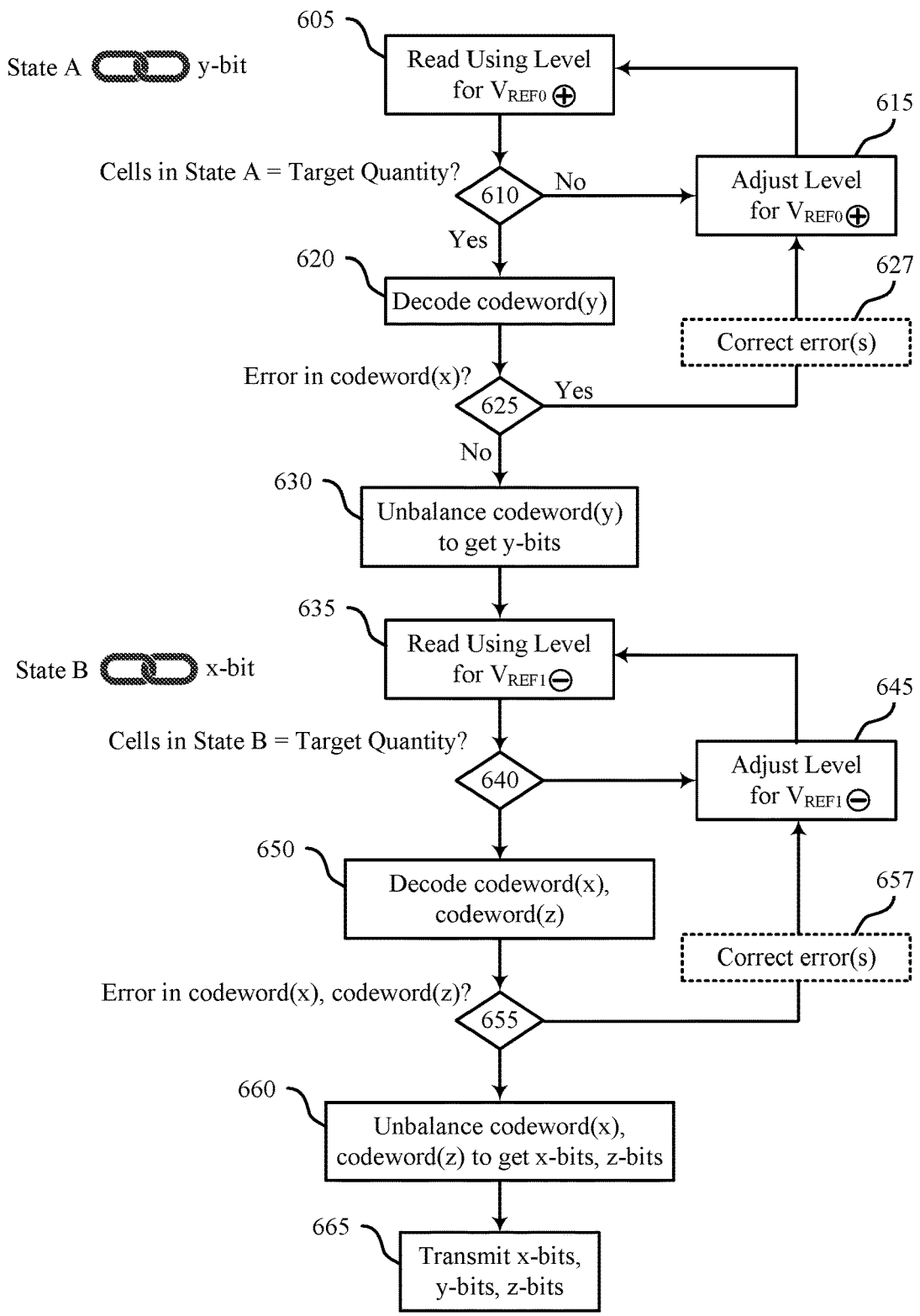
FIG. 6 illustrates an example of a retrieval process that supports balanced codewords for reducing a selected state in memory cells in accordance with examples as disclosed herein.

FIG. 6 illustrates an example of a retrieval process 600 that supports balanced codewords for reducing a selected state in memory cells in accordance with examples as disclosed herein. A memory device may implement the retrieval process 600 to read multiple codewords (e.g., codeword(x), codeword(y), codeword(z)) that enable a dynamic sensing technique as described herein. For example, the retrieval process 600 may be performed using codewords generated according to the storage process 400. FIG. 6 illustrates use of opposite polarity sensing with the dynamic sensing technique, where the first read voltage is positive (e.g., $V_{REF0=Positive}$) and the second read voltage is negative ($V_{REF1=Negative}$). That is, the retrieval process 600 may be an example of a positive polarity-first dynamic sensing scheme. The memory device may implement the retrieval process 600 in response to a request from another device (e.g., a host device) for data stored at the memory device (e.g., the sequence of data bits 405).

At 605, the memory device may read a set of ternary cells that stores codeword(x), codeword(y), and codeword(z). The memory device may read the set of ternary cells using a positive level for a first read voltage (e.g., $V_{REF0=Positive}$) that is for sensing State A. For example, the memory device may apply $V_{REF0=Positive}$ to the set of ternary cells. The memory device may determine how many ternary cells are in State A based on reading the set of ternary cells using $V_{REF0=Positive}$. Per the coding scheme 300-b, State A is linked directly to the y-bit, so sensing State A allows the memory device to read codeword(y).

At 610, the memory device may determine whether the quantity of ternary cells in State A is equal to the target quantity for State A (e.g., as defined by the target distribution of states). The memory device may determine whether the quantity of ternary cells in State A is equal to the target quantity for State A by comparing the quantity of ternary cells in State A with the target quantity for State A. Alternatively, the memory device may determine whether the ratio of ternary cells in State A (relative to the total quantity of states) is equal to the target ratio for State A.

If, at 610, the quantity of ternary cells in State A is determined to be different (e.g., less than) than the target quantity for State A, the memory device may proceed to 615 and adjust the level for the first read voltage (e.g., the memory device may increase $V_{REF0=Positive}$). The memory device may then repeat the operations at 605 and 610 using the adjusted level for $V_{REF0=Positive}$. If, at 610, the quantity of ternary cells in State A is determined to be equal to the target quantity for State A, the memory device select the level as the correct level for the first read voltage $V_{REF0=Positive}$ and proceed to 620.

At 620, the memory device may perform ECC decoding to detect any errors in codeword(y). For example, the memory device may perform ECC decoding using syndrome bits that are based on the codeword(y) and the Hamming matrix (e.g., ECC code) used to generate codeword(y). At 625, the memory device may determine whether any errors were detected in codeword(y). If the memory device detects one or more errors in codeword(y) at 625, the memory device may correct the error(s) at 627 before proceeding to 615 (where the memory device may adjust the level for $V_{REF0=Positive}$ based on the error(s) in codeword(y)).

If the memory device detects no errors in codeword(y) at 625, the memory device may proceed to 630 and unbalance codeword(y) to obtain the original logic values for the y-bits. The unbalancing may occur in the binary domain or the state domain. In some examples, the memory device may unbalance codeword(y) based on balancing information bits (e.g., balancing index(y)) that indicate the packets of codeword(y) that were inverted as part of balancing during the storage process. Although shown occurring before 635, the memory device wait until later in the process (e.g., after setting the correct value for $V_{REF1=Negative}$, at 660) to unbalance codeword(y) (because some of the balancing information bits in balancing index(y,z) may be x-bits and/or z-bits that are determined based on $V_{REF1=Negative}$).

At 635, the memory device may read the set of ternary cells that stores codeword(x), codeword(y), and codeword (z). The memory device may read the set of ternary cells using a negative level for a second read voltage (e.g., $V_{REF1=Negative}$) that is for sensing State B. For example, the memory device may apply $V_{REF1=Negative}$ to the set of ternary cells. The memory device may determine how many ternary cells are in State B based on reading the set of ternary cells using $V_{REF1=Negative}$. Per the coding scheme 300-b, State B is linked directly to the x-bit, so sensing State B allows the memory device to read codeword(x) (and thus codeword(z)).

At 640, the memory device may determine whether the quantity of ternary cells in State B is equal to the target quantity for State B (e.g., as defined by the target distribution of states). The memory device may determine whether the quantity of ternary cells in State B is equal to the target quantity for State B by comparing the quantity of ternary cells in State B with the target quantity for State B. Alternatively, the memory device may determine whether the ratio of ternary cells in State B (relative to the total quantity of states) is equal to the target ratio for State B.

If, at 640, the quantity of ternary cells in State B is determined to be different (e.g., less than) than the target quantity for State B, the memory device may proceed to 645 and adjust the level for the second read voltage (e.g., the memory device may decrease $V_{REF1=Negative}$). The memory device may then repeat the operations at 635 and 640 using the adjusted level for $V_{REF1=Negative}$. If, at 640, the quantity of ternary cells in State B is determined to be equal to the target quantity for State B, the memory device select the level as the correct level for the second read voltage $V_{REF1=Negative}$ and proceed to 650.

At 650, the memory device may perform ECC decoding to detect any errors in codeword(x) and/or codeword(z). For example, the memory device may perform ECC decoding using syndrome bits that are based on the codeword(x) and/or codeword(z) and the Hamming matrix used to generate the codewords. At 655, the memory device may determine whether any errors were detected in codeword(x) or codeword(z). If the memory device detects one or more errors in the codeword(s) at 655, the memory device may correct the error(s) at 657 before proceeding to 645 (where the memory device may adjust the level for $V_{REF1=Negative}$ based on the error(s) in the codeword(s)).

If the memory device detects no errors in the codeword(s) at 655, the memory device may proceed to 660 and unbalance codeword(x) and codeword(z) to obtain the original logic values for the x-bits and the z-bits. The unbalancing may occur in the binary domain, in the state domain, or both. So, the memory device may recover the original sets of x-bits, y-bits, and z-bits. Accordingly, at 665, the memory device may return (e.g., communicate) the sequence of data bits 405 to the requesting device.

Thus, the memory device may use a dynamic sensing technique—enabled by multiple codewords—to set correct levels for $V_{REF0}$ and $V_{REF1}$.

Figure 7:
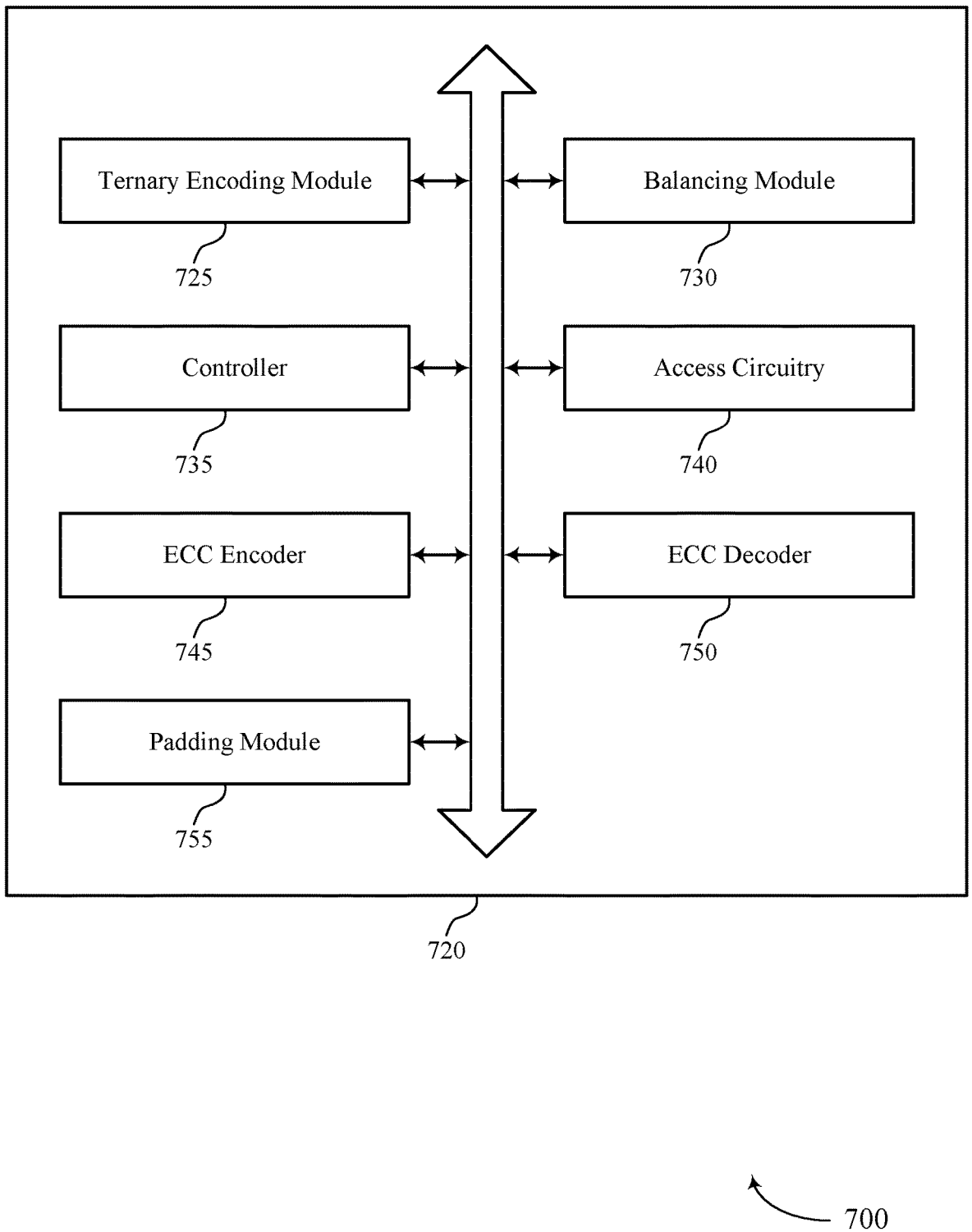
FIG. 7 shows a block diagram of a memory device that supports balanced codewords for reducing a selected state in memory cells in accordance with examples as disclosed herein.

FIG. 7 shows a block diagram of a memory device 700 that supports balanced codewords for reducing a selected state in memory cells in accordance with examples as disclosed herein. The memory device 720 may be an example of aspects of a memory device as described with reference to FIGS. 1 through 6. The memory device 720, or various components thereof, may be an example of means for performing various aspects of balanced codewords for reducing a selected state in memory cells as described herein. For example, the memory device 720 may include a ternary encoding module 725, a balancing module 730, a controller 735, an access circuitry 740, a ECC encoder 745, a ECC decoder 750, a padding module 755, or any combination thereof. Each of these components may communicate, directly or indirectly, with one another (e.g., via one or more buses).

The ternary encoding module 725 may be or include an example of a ternary encoding component. Additionally or alternatively, the ternary encoding module 725 may be implemented by or as part of a controller, processor, or other hardware or software. The ternary encoding module 725 may be configured as or otherwise support a means for dividing a sequence of bits into a first set of bits and a second set of bits.

The balancing module 730 may be configured as or otherwise support a means for inverting a first portion of a first codeword that includes the first set of bits to reach a first target ratio of logic values in the first codeword. The balancing module 730 may be or include an example of a balancing component. Additionally or alternatively, the balancing module 730 may be implemented by or as part of a controller, processor, or other hardware or software. In some examples, the balancing module 730 may comprise a set of logic gates (e.g., XOR gates where one input is for a control signal and the other input is for a bit for a data bit).

The controller 735 may be configured as or otherwise support a means for determining, after inverting the first portion and based at least in part on a coding scheme, a set of states associated with the second set of bits and the first set of bits including the inverted first portion. In some examples, the controller 735 may be configured as or otherwise support a means for changing a subset of the set of states to reach a second target ratio of states in the set of states. In some examples, the balancing module 730 may be configured as or otherwise support a means for determining, based at least in part on the coding scheme, a second portion of the second set of bits associated with the changed subset of the set of states. The access circuitry 740 may be configured as or otherwise support a means for writing, to a set of memory cells according to the coding scheme, the first codeword and a second codeword including the second set of bits including the second portion.

In some examples, the set of memory cells includes ternary memory cells programmable to a first state, a second state, and a third state. In some examples, the coding scheme maps three bits to a pair of ternary cells.

In some examples, the controller 735 may be configured as or otherwise support a means for determining a third target ratio for the first state, the second state, and the third state. In some examples, the controller 735 may be configured as or otherwise support a means for selecting the coding scheme used to determine the set of states based at least in part on the third target ratio.

In some examples, the controller 735 may be configured as or otherwise support a means for determining a polarity of a read voltage used for sensing the set of memory cells. In some examples, the controller 735 may be configured as or otherwise support a means for selecting the coding scheme used to determine the set of states based at least in part on the polarity.

In some examples, the first set of bits in the first codeword includes bits assigned to a first bit-position associated with the three bits. In some examples, the second set of bits in the second codeword includes bits assigned to a second bit-position associated with the three bits. In some examples, the second set of bits in the second codeword includes bits assigned to a third bit-position associated with the three bits.

In some examples, to support dividing the sequence of bits, the ternary encoding module 725 may be configured as or otherwise support a means for dividing the sequence of bits into a third set of bits that includes bits assigned to a third bit-position associated with the three bits, where the set of states is associated with the third set of bits; and where inverting includes. In some examples, to support dividing the sequence of bits, the balancing module 730 may be configured as or otherwise support a means for determining, based at least in part on the coding scheme, a third portion of the third set of bits associated with the changed subset of the set of states, where a third codeword including the third set of bits including the third portion is written to the set of memory cells.

In some examples, the ECC encoder 745 may be configured as or otherwise support a means for generating, before inverting the first portion of the first codeword, parity bits that are based at least in part on the first set of bits, where the first codeword includes the parity bits.

In some examples, the ECC encoder 745 may be configured as or otherwise support a means for generating, after inverting the second portion of the second set of bits, parity bits based at least in part on the second set of bits, where the second codeword includes the parity bits.

In some examples, the access circuitry 740 may be configured as or otherwise support a means for storing a first set of balancing information bits that indicates the inverted first portion of the first codeword. In some examples, the access circuitry 740 may be configured as or otherwise support a means for storing a second set of balancing information bits that indicates the second portion of the second set of bits.

In some examples, the padding module 755 may be configured as or otherwise support a means for adding, after inverting the first portion of the first codeword and based at least in part on the first set of balancing information bits, a padding bit to the first set of bits, where the set of states is based at least in part on the padding bit. The padding module 755 may be or include an example of a balancing component. Additionally or alternatively, the padding module 755 may be implemented by or as part of a controller, processor, or other hardware or software. In some examples, the padding module 755 may include a counter (e.g., for counting quantities of logic values or states) and a comparator (for comparing target quantities of logic values or states with counted quantities of logic values or states).

In some examples, the access circuitry 740 may be configured as or otherwise support a means for reading, using a first level for a first read voltage for sensing a first state, a first codeword from a set of ternary cells in a memory array, each ternary cell programmable to the first state, a second state, and a third state. In some examples, the controller 735 may be configured as or otherwise support a means for selecting a second level for the first read voltage based at least in part on an error detected in the first codeword. In some examples, the access circuitry 740 may be configured as or otherwise support a means for reading, using a third level for a second read voltage for sensing the second state, a second codeword and a third codeword from the set of ternary cells. In some examples, the controller 735 may be configured as or otherwise support a means for selecting a fourth level for the second read voltage based at least in part on an error detected in the second codeword, an error in detected in the third codeword, or both.

In some examples, the controller 735 may be configured as or otherwise support a means for determining, based at least in part on reading using the first level, that a threshold quantity of ternary cells in the set of ternary cells are in the first state. In some examples, the ECC decoder 750 may be configured as or otherwise support a means for decoding the first codeword based at least in part on determining that the threshold quantity of ternary cells are in the first state, where the error is detected based at least in part on decoding the first codeword.

In some examples, the balancing module 730 may be configured as or otherwise support a means for inverting a first portion of the first codeword based at least in part on determining that the threshold quantity of ternary cells are in the first state, where the first codeword is decoded before inverting the first portion.

In some examples, the controller 735 may be configured as or otherwise support a means for determining, based at least in part on reading using the third level, that a threshold quantity of ternary cells in the set of ternary cells are in the second state. In some examples, the ECC decoder 750 may be configured as or otherwise support a means for decoding the second codeword and the third codeword based at least in part on determining that the threshold quantity of ternary cells are in the second state, where the error in the second codeword, the error in the third codeword, or both, are detected based at least in part on decoding the second codeword and the third codeword.

In some examples, the balancing module 730 may be configured as or otherwise support a means for inverting a second portion of the second codeword based at least in part on determining that the threshold quantity of ternary cells are in the second state, where the second codeword is decoded before inverting the second portion. In some examples, the balancing module 730 may be configured as or otherwise support a means for inverting a third portion of the third codeword based at least in part on determining that the threshold quantity are ternary cells are in the second state, where the third codeword is decoded before inverting the third portion.

In some examples, the first codeword, and the access circuitry 740 may be configured as or otherwise support a means for reading a second set of ternary cells that stores codewords associated with a second sequence of bits, where reading the second set of ternary cells includes applying a positive read voltage for sensing the second state before applying a negative voltage for sensing the first state.

In some examples, the first codeword, and the access circuitry 740 may be configured as or otherwise support a means for reading a second set of ternary cells that stores codewords associated with a second sequence of bits, where reading the second set of ternary cells includes applying a negative read voltage for sensing the second state before applying a positive voltage for sensing the first state.

In some examples, the first level and the second level are positive levels. In some examples, the third level and the second level are negative levels. In some examples, the first level and the second level are negative levels. In some examples, the third level and the second level are positive levels.

Figure 8:
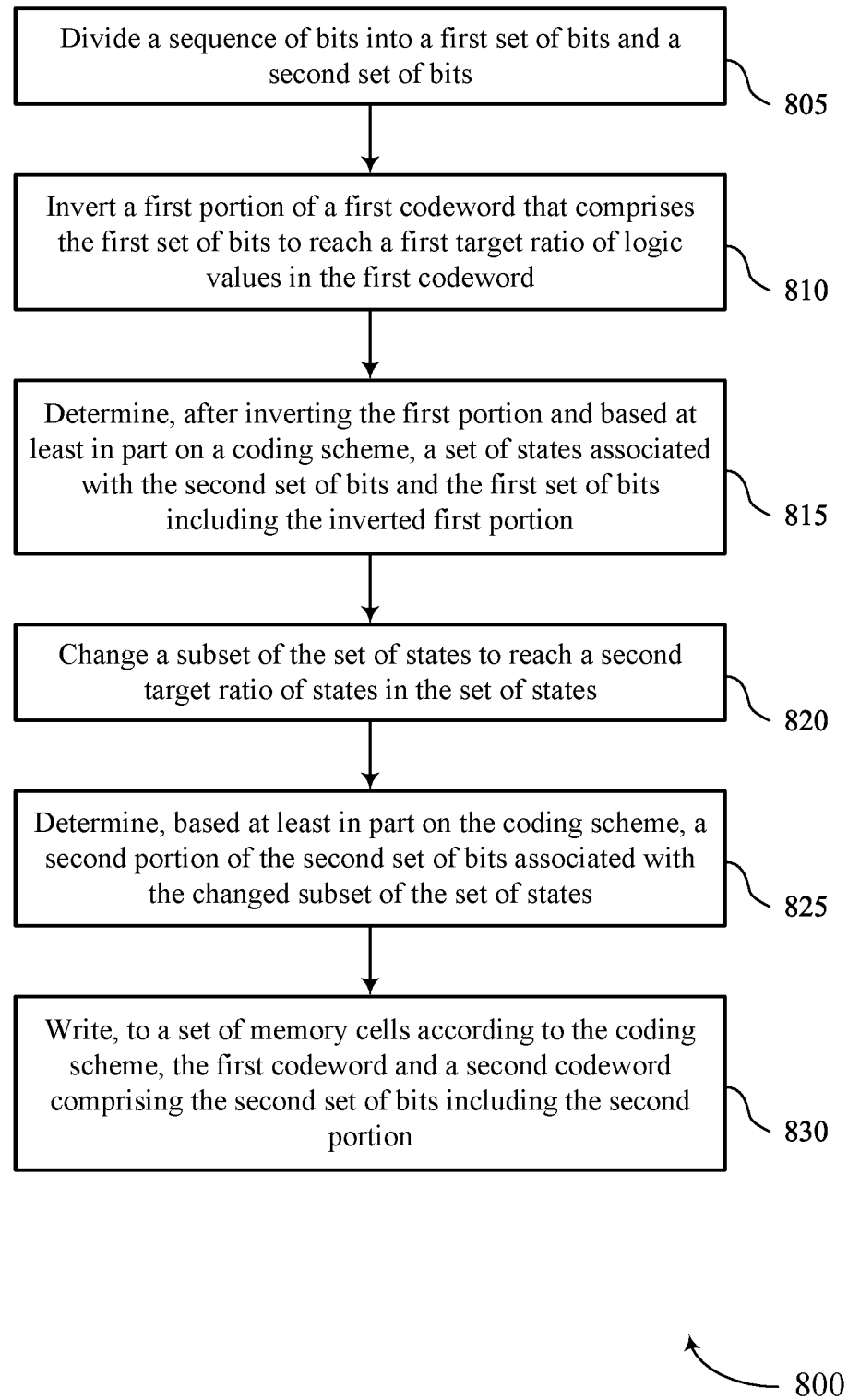
FIGS. 8 and 9 show flowcharts illustrating a method or methods that support balanced codewords for reducing a selected state in memory cells in accordance with examples as disclosed herein.

FIG. 8 shows a flowchart illustrating a method 800 that supports balanced codewords for reducing a selected state in memory cells in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally, or alternatively, the memory device may perform aspects of the described functions using special-purpose hardware.

At 805, the method may include dividing a sequence of bits into a first set of bits (e.g., x-bits) and a second set of bits (e.g., y-bits, or y- and z-bits). The operations of 805 may be performed in accordance with examples as disclosed herein. In some examples, aspects of the operations of 805 may be performed by a ternary encoding module 725 as described with reference to FIG. 7.

At 810, the method may include inverting a first portion of a first codeword (e.g., codeword(x)) that includes the first set of bits to reach a first target ratio of logic values (e.g., 50% logic ones, 50% logic zeros) in the first codeword. The operations of 810 may be performed in accordance with examples as disclosed herein. In some examples, aspects of the operations of 810 may be performed by a balancing module 730 as described with reference to FIG. 7.

At 815, the method may include determining, after inverting the first portion and based at least in part on a coding scheme, a set of states associated with the second set of bits and the first set of bits including the inverted first portion. The operations of 815 may be performed in accordance with examples as disclosed herein. In some examples, aspects of the operations of 815 may be performed by a controller 735 as described with reference to FIG. 7.

At 820, the method may include changing a subset of the set of states to reach a second target ratio of states in the set of states. The operations of 820 may be performed in accordance with examples as disclosed herein. In some examples, aspects of the operations of 820 may be performed by a controller 735 as described with reference to FIG. 7.

At 825, the method may include determining, based at least in part on the coding scheme, a second portion of the second set of bits associated with the changed subset of the set of states. The operations of 825 may be performed in accordance with examples as disclosed herein. In some examples, aspects of the operations of 825 may be performed by a balancing module 730 as described with reference to FIG. 7.

At 830, the method may include writing, to a set of memory cells according to the coding scheme, the first codeword (e.g., codeword(x)) and a second codeword (e.g., codeword(y) or codeword(y,z)) including the second set of bits including the second portion. The operations of 830 may be performed in accordance with examples as disclosed herein. In some examples, aspects of the operations of 830 may be performed by an access circuitry 740 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for dividing a sequence of bits into a first set of bits and a second set of bits; inverting a first portion of a first codeword that includes the first set of bits to reach a first target ratio of logic values in the first codeword; determining, after inverting the first portion and based at least in part on a coding scheme, a set of states associated with the second set of bits and the first set of bits including the inverted first portion; changing a subset of the set of states to reach a second target ratio of states in the set of states; determining, based at least in part on the coding scheme, a second portion of the second set of bits associated with the changed subset of the set of states; and writing, to a set of memory cells according to the coding scheme, the first codeword and a second codeword including the second set of bits including the second portion.

Aspect 2: The method, apparatus, or non-transitory computer-readable medium of aspect 1, where the set of memory cells includes ternary memory cells programmable to a first state, a second state, and a third state and the coding scheme maps three bits to a pair of ternary cells.

Aspect 3: The method, apparatus, or non-transitory computer-readable medium of aspect 2, further including operations, features, circuitry, logic, means, or instructions, or any combination thereof for determining a third target ratio for the first state, the second state, and the third state and selecting the coding scheme used to determine the set of states based at least in part on the third target ratio.

Aspect 4: The method, apparatus, or non-transitory computer-readable medium of any of aspects 2 through 3, further including operations, features, circuitry, logic, means, or instructions, or any combination thereof for determining a polarity of a read voltage used for sensing the set of memory cells and selecting the coding scheme used to determine the set of states based at least in part on the polarity.

Aspect 5: The method, apparatus, or non-transitory computer-readable medium of any of aspects 2 through 4, where the first set of bits in the first codeword includes bits assigned to a first bit-position associated with the three bits and the second set of bits in the second codeword includes bits assigned to a second bit-position associated with the three bits.

Aspect 6: The method, apparatus, or non-transitory computer-readable medium of aspect 5, where the second set of bits in the second codeword includes bits assigned to a third bit-position associated with the three bits.

Aspect 7: The method, apparatus, or non-transitory computer-readable medium of any of aspects 5 through 6, where dividing the sequence of bits includes operations, features, circuitry, logic, means, or instructions, or any combination thereof for dividing the sequence of bits into a third set of bits that includes bits assigned to a third bit-position associated with the three bits, where the set of states is associated with the third set of bits; and where inverting includes and determining, based at least in part on the coding scheme, a third portion of the third set of bits associated with the changed subset of the set of states, where a third codeword including the third set of bits including the third portion is written to the set of memory cells.

Aspect 8: The method, apparatus, or non-transitory computer-readable medium of any of aspects 1 through 7, further including operations, features, circuitry, logic, means, or instructions, or any combination thereof for generating, before inverting the first portion of the first codeword, parity bits that are based at least in part on the first set of bits, where the first codeword includes the parity bits.

Aspect 9: The method, apparatus, or non-transitory computer-readable medium of any of aspects 1 through 8, further including operations, features, circuitry, logic, means, or instructions, or any combination thereof for generating, after inverting the second portion of the second set of bits, parity bits based at least in part on the second set of bits, where the second codeword includes the parity bits.

Aspect 10: The method, apparatus, or non-transitory computer-readable medium of any of aspects 1 through 9, further including operations, features, circuitry, logic, means, or instructions, or any combination thereof for storing a first set of balancing information bits that indicates the inverted first portion of the first codeword and storing a second set of balancing information bits that indicates the second portion of the second set of bits.

Aspect 11: The method, apparatus, or non-transitory computer-readable medium of aspect 10, further including operations, features, circuitry, logic, means, or instructions, or any combination thereof for adding, after inverting the first portion of the first codeword and based at least in part on the first set of balancing information bits, a padding bit to the first set of bits, where the set of states is based at least in part on the padding bit.

Figure 9:
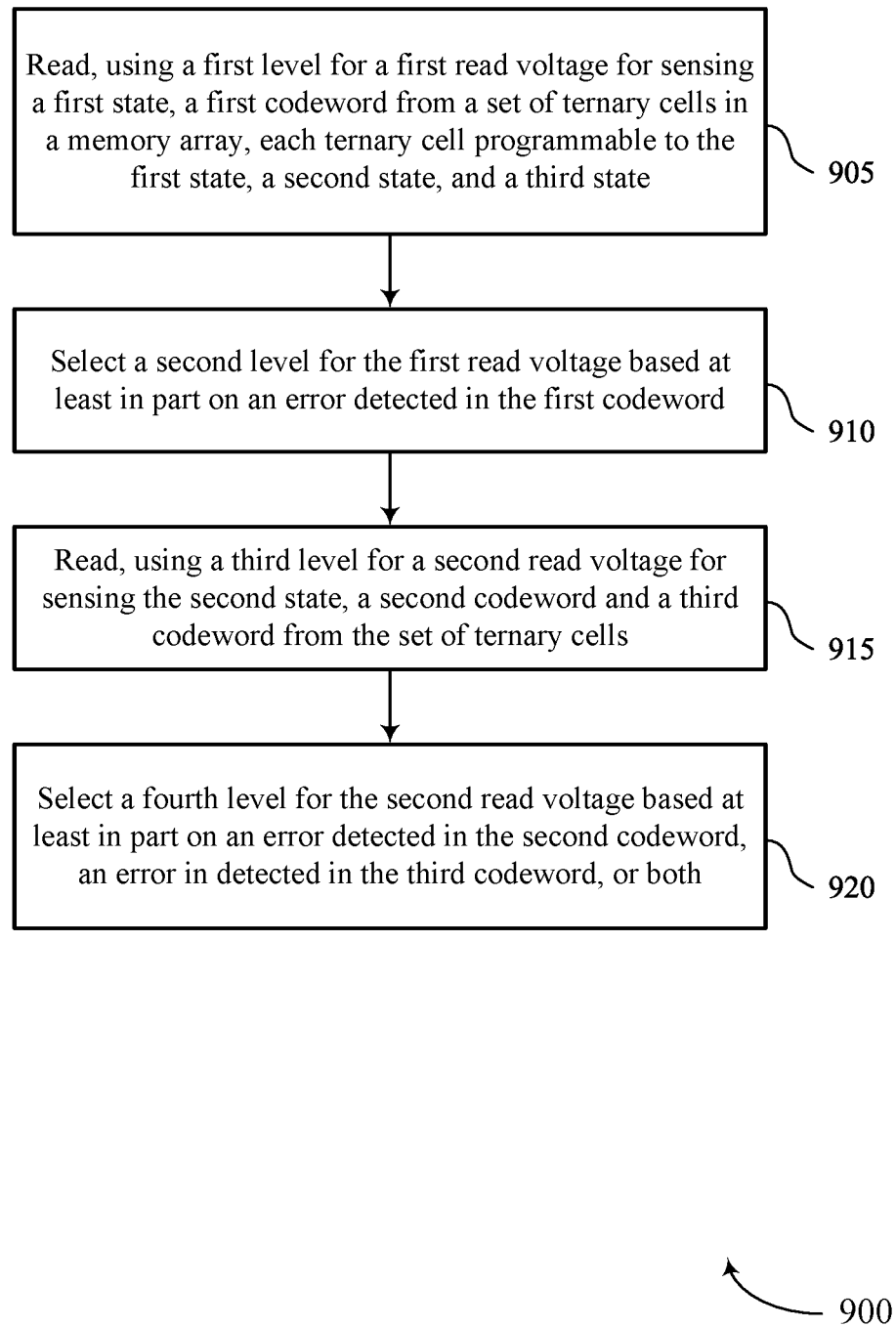

FIG. 9 shows a flowchart illustrating a method 900 that supports balanced codewords for reducing a selected state in memory cells in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally, or alternatively, the memory device may perform aspects of the described functions using special-purpose hardware.

At 905, the method may include reading, using a first level for a first read voltage (e.g., $V_{REF1}$) for sensing a first state (e.g., State B), a first codeword (e.g., codeword(x)) from a set of ternary cells in a memory array, each ternary cell programmable to the first state, a second state, and a third state. The operations of 905 may be performed in accordance with examples as disclosed herein. In some examples, aspects of the operations of 905 may be performed by an access circuitry 740 as described with reference to FIG. 7.

At 910, the method may include selecting a second level for the first read voltage based at least in part on an error detected in the first codeword. The operations of 910 may be performed in accordance with examples as disclosed herein. In some examples, aspects of the operations of 910 may be performed by a controller 735 as described with reference to FIG. 7.

At 915, the method may include reading, using a third level for a second read voltage (e.g., $V_{REF0}$) for sensing the second state (e.g., State A), a second codeword (e.g., codeword(y)) and a third codeword (e.g., codeword(z)) from the set of ternary cells. The operations of 915 may be performed in accordance with examples as disclosed herein. In some examples, aspects of the operations of 915 may be performed by an access circuitry 740 as described with reference to FIG. 7.

At 920, the method may include selecting a fourth level for the second read voltage based at least in part on an error detected in the second codeword, an error in detected in the third codeword, or both. The operations of 920 may be performed in accordance with examples as disclosed herein. In some examples, aspects of the operations of 920 may be performed by a controller 735 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 12: A method, apparatus, or non-transitory computer-readable medium including operations, features, circuitry, logic, means, or instructions, or any combination thereof for reading, using a first level for a first read voltage for sensing a first state, a first codeword from a set of ternary cells in a memory array, each ternary cell programmable to the first state, a second state, and a third state; selecting a second level for the first read voltage based at least in part on an error detected in the first codeword; reading, using a third level for a second read voltage for sensing the second state, a second codeword and a third codeword from the set of ternary cells; and selecting a fourth level for the second read voltage based at least in part on an error detected in the second codeword, an error in detected in the third codeword, or both.

Aspect 13: The method, apparatus, or non-transitory computer-readable medium of aspect 12, further including operations, features, circuitry, logic, means, or instructions, or any combination thereof for determining, based at least in part on reading using the first level, that a threshold quantity of ternary cells in the set of ternary cells are in the first state and decoding the first codeword based at least in part on determining that the threshold quantity of ternary cells are in the first state, where the error is detected based at least in part on decoding the first codeword.

Aspect 14: The method, apparatus, or non-transitory computer-readable medium of aspect 13, further including operations, features, circuitry, logic, means, or instructions, or any combination thereof for inverting a first portion of the first codeword based at least in part on determining that the threshold quantity of ternary cells are in the first state, where the first codeword is decoded before inverting the first portion.

Aspect 15: The method, apparatus, or non-transitory computer-readable medium of any of aspects 12 through 14, further including operations, features, circuitry, logic, means, or instructions, or any combination thereof for determining, based at least in part on reading using the third level, that a threshold quantity of ternary cells in the set of ternary cells are in the second state and decoding the second codeword and the third codeword based at least in part on determining that the threshold quantity of ternary cells are in the second state, where the error in the second codeword, the error in the third codeword, or both, are detected based at least in part on decoding the second codeword and the third codeword.

Aspect 16: The method, apparatus, or non-transitory computer-readable medium of aspect 15, further including operations, features, circuitry, logic, means, or instructions, or any combination thereof for inverting a second portion of the second codeword based at least in part on determining that the threshold quantity of ternary cells are in the second state, where the second codeword is decoded before inverting the second portion and inverting a third portion of the third codeword based at least in part on determining that the threshold quantity are ternary cells are in the second state, where the third codeword is decoded before inverting the third portion.

Aspect 17: The method, apparatus, or non-transitory computer-readable medium of any of aspects 12 through 16, where the first codeword and the method, apparatuses, and non-transitory computer-readable medium further includes operations, features, circuitry, logic, means, or instructions, or any combination thereof for reading a second set of ternary cells that stores codewords associated with a second sequence of bits, where reading the second set of ternary cells includes applying a positive read voltage for sensing the second state before applying a negative voltage for sensing the first state.

Aspect 18: The method, apparatus, or non-transitory computer-readable medium of any of aspects 12 through 17, where the first codeword and the method, apparatuses, and non-transitory computer-readable medium further includes operations, features, circuitry, logic, means, or instructions, or any combination thereof for reading a second set of ternary cells that stores codewords associated with a second sequence of bits, where reading the second set of ternary cells includes applying a negative read voltage for sensing the second state before applying a positive voltage for sensing the first state.

Aspect 19: The method, apparatus, or non-transitory computer-readable medium of any of aspects 12 through 18, where the first level and the second level are positive levels and the third level and the second level are negative levels.

Aspect 20: The method, apparatus, or non-transitory computer-readable medium of any of aspects 12 through 19, where the first level and the second level are negative levels and the third level and the second level are positive levels.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   dividing a sequence of bits into a first set of bits and a second set of bits;
   inverting a first portion of a first codeword that comprises the first set of bits to reach a first target ratio of logic values in the first codeword;
   determining, after inverting the first portion and based at least in part on a coding scheme, a set of states associated with the second set of bits and the first set of bits including the inverted first portion;
   changing a subset of the set of states to reach a second target ratio of states in the set of states;
   determining, based at least in part on the coding scheme, a second portion of the second set of bits associated with the changed subset of the set of states; and
   writing, to a set of memory cells according to the coding scheme, the first codeword and a second codeword comprising the second set of bits including the second portion.

2. The method of claim 1, wherein the set of memory cells comprises ternary memory cells programmable to a first state, a second state, and a third state, and wherein the coding scheme maps three bits to a pair of ternary cells.

3. The method of claim 2, further comprising:
determining a third target ratio for the first state, the second state, and the third state; and
selecting the coding scheme used to determine the set of states based at least in part on the third target ratio.

4. The method of claim 2, further comprising:
determining a polarity of a read voltage used for sensing the set of memory cells; and
selecting the coding scheme used to determine the set of states based at least in part on the polarity.

5. The method of claim 2, wherein the first set of bits in the first codeword comprises bits assigned to a first bit-position associated with the three bits, and wherein the second set of bits in the second codeword comprises bits assigned to a second bit-position associated with the three bits.

6. The method of claim 5, wherein the second set of bits in the second codeword comprises bits assigned to a third bit-position associated with the three bits.

7. The method of claim 5, wherein dividing the sequence of bits comprises:
dividing the sequence of bits into a third set of bits that comprises bits assigned to a third bit-position associated with the three bits, wherein the set of states is associated with the third set of bits; and wherein inverting comprises:
determining, based at least in part on the coding scheme, a third portion of the third set of bits associated with the changed subset of the set of states, wherein a third codeword comprising the third set of bits including the third portion is written to the set of memory cells.

8. The method of claim 1, further comprising:
generating, before inverting the first portion of the first codeword, parity bits that are based at least in part on the first set of bits, wherein the first codeword comprises the parity bits.

9. The method of claim 1, further comprising:
generating, after inverting the second portion of the second set of bits, parity bits based at least in part on the second set of bits, wherein the second codeword comprises the parity bits.

10. The method of claim 1, further comprising:
storing a first set of balancing information bits that indicates the inverted first portion of the first codeword; and
storing a second set of balancing information bits that indicates the second portion of the second set of bits.

11. The method of claim 10, further comprising:
adding, after inverting the first portion of the first codeword and based at least in part on the first set of balancing information bits, at least one padding bit to the first set of bits, wherein the set of states is based at least in part on the at least one padding bit.

12. An apparatus, comprising:
an array of memory cells comprising a set of memory cells; and
a controller coupled with the array of memory cells and configured to cause the apparatus to:
divide a sequence of bits into a first set of bits and a second set of bits;
invert a first portion of a first codeword that comprises the first set of bits to reach a first target ratio of logic values in the first codeword;
determine, after inverting the first portion and based at least in part on a coding scheme, a set of states associated with the second set of bits and the first set of bits including the inverted first portion;
change a subset of the set of states to reach a second target ratio of states in the set of states;
determine, based at least in part on the coding scheme, a second portion of the second set of bits associated with the changed subset of the set of states; and
write, to the set of memory cells according to the coding scheme, the first codeword and a second codeword comprising the second set of bits including the second portion.

13. The apparatus of claim 12, wherein the controller is further configured to cause the apparatus to:
determine a third target ratio for a first state, a second state, and a third state; and
select the coding scheme used to determine the set of states based at least in part on the third target ratio.

* * * * *